US009401409B2

(12) United States Patent
Lee et al.

(10) Patent No.: US 9,401,409 B2
(45) Date of Patent: *Jul. 26, 2016

(54) HIGH DENSITY MOSFET ARRAY WITH SELF-ALIGNED CONTACTS ENHANCEMENT PLUG AND METHOD

(71) Applicant: Alpha and Omega Semiconductor Incorporated, Sunnyvale, CA (US)

(72) Inventors: Yeeheng Lee, San Jose, CA (US); Jongoh Kim, Portland, OR (US); Hong Chang, Saratoga, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/884,738

(22) Filed: Oct. 15, 2015

(65) Prior Publication Data
US 2016/0035846 A1    Feb. 4, 2016

Related U.S. Application Data

(60) Division of application No. 14/197,216, filed on Mar. 5, 2015, now Pat. No. 9,196,701, which is a continuation-in-part of application No. 13/794,628, filed on Mar. 11, 2013, now Pat. No. 9,136,377.

(51) Int. Cl.
| H01L 21/3205 | (2006.01) |
| H01L 27/148 | (2006.01) |
| H01L 29/423 | (2006.01) |
| H01L 29/417 | (2006.01) |
| H01L 29/66 | (2006.01) |
| H01L 29/78 | (2006.01) |

(52) U.S. Cl.
CPC ...... *H01L 29/4236* (2013.01); *H01L 29/41766* (2013.01); *H01L 29/66719* (2013.01); *H01L 29/66734* (2013.01); *H01L 29/7813* (2013.01); *H01L 29/42368* (2013.01); *H01L 29/7803* (2013.01)

(58) Field of Classification Search
CPC ............... H01L 29/4236; H01L 29/49; H01L 29/66734
USPC ............... 438/586–589, 270; 257/250, 330
See application file for complete search history.

(56) References Cited

U.S. PATENT DOCUMENTS 9,136,377 B2 * 9/2015 Lee ................... H01L 29/7827
257/331

* cited by examiner

Primary Examiner — Calvin Lee

(57) ABSTRACT

A semiconductor substrate comprises epitaxial region, body region and source region; an array of interdigitated active nitride-capped trench gate stacks (ANCTGS) and self-guided contact enhancement plugs (SGCEP) disposed above the semiconductor substrate and partially embedded into the source region, the body region and the epitaxial region forming the trench-gated MOSFET array. Each ANCTGS comprises a stack of a polysilicon trench gate embedded in a gate oxide shell and a silicon nitride spacer cap covering the top of the polysilicon trench gate; each SGCEP comprises a lower intimate contact enhancement section (ICES) in accurate registration to its neighboring ANCTGS; an upper distal contact enhancement section (DCES) having a lateral mis-registration (LTMSRG) to the neighboring ANCTGS; and an intervening tapered transitional section (TTS) bridging the ICES and the DCES; a patterned metal layer atop the patterned dielectric region atop the MOSFET array forms self-guided source and body contacts through the SGCEP.

11 Claims, 20 Drawing Sheets

Present Invention

Present Invention

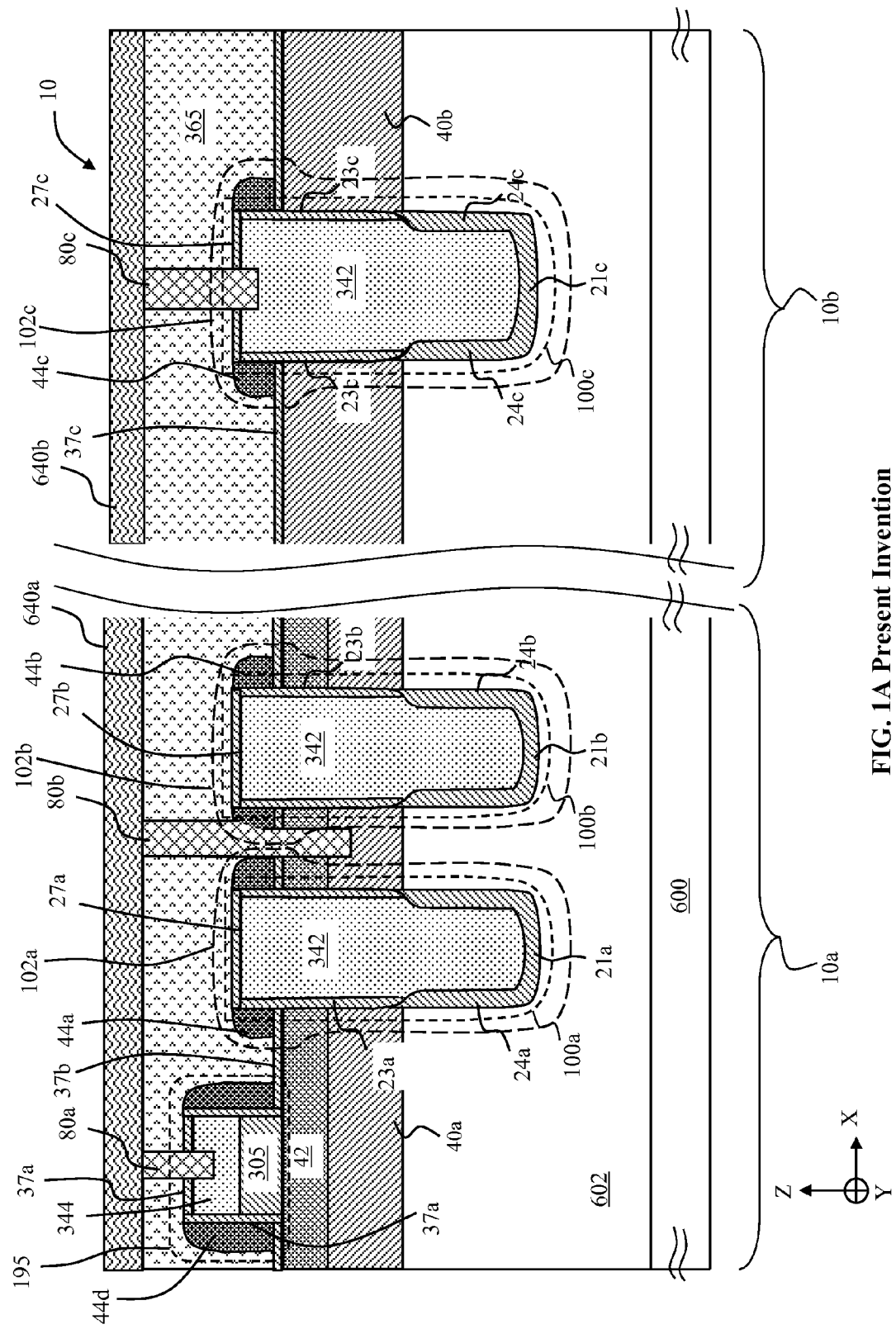
FIG. 1A Present Invention

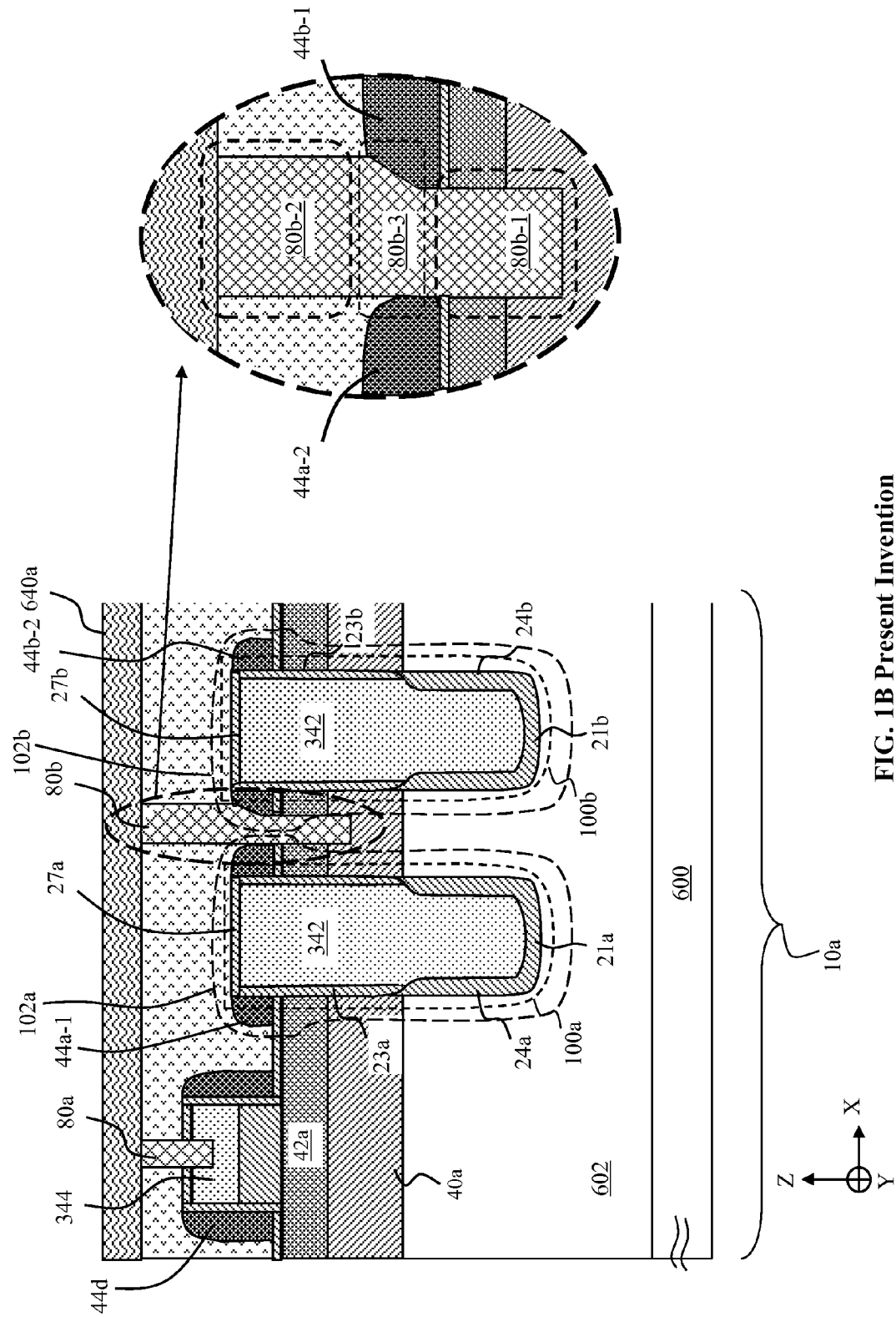
FIG. 1B Present Invention

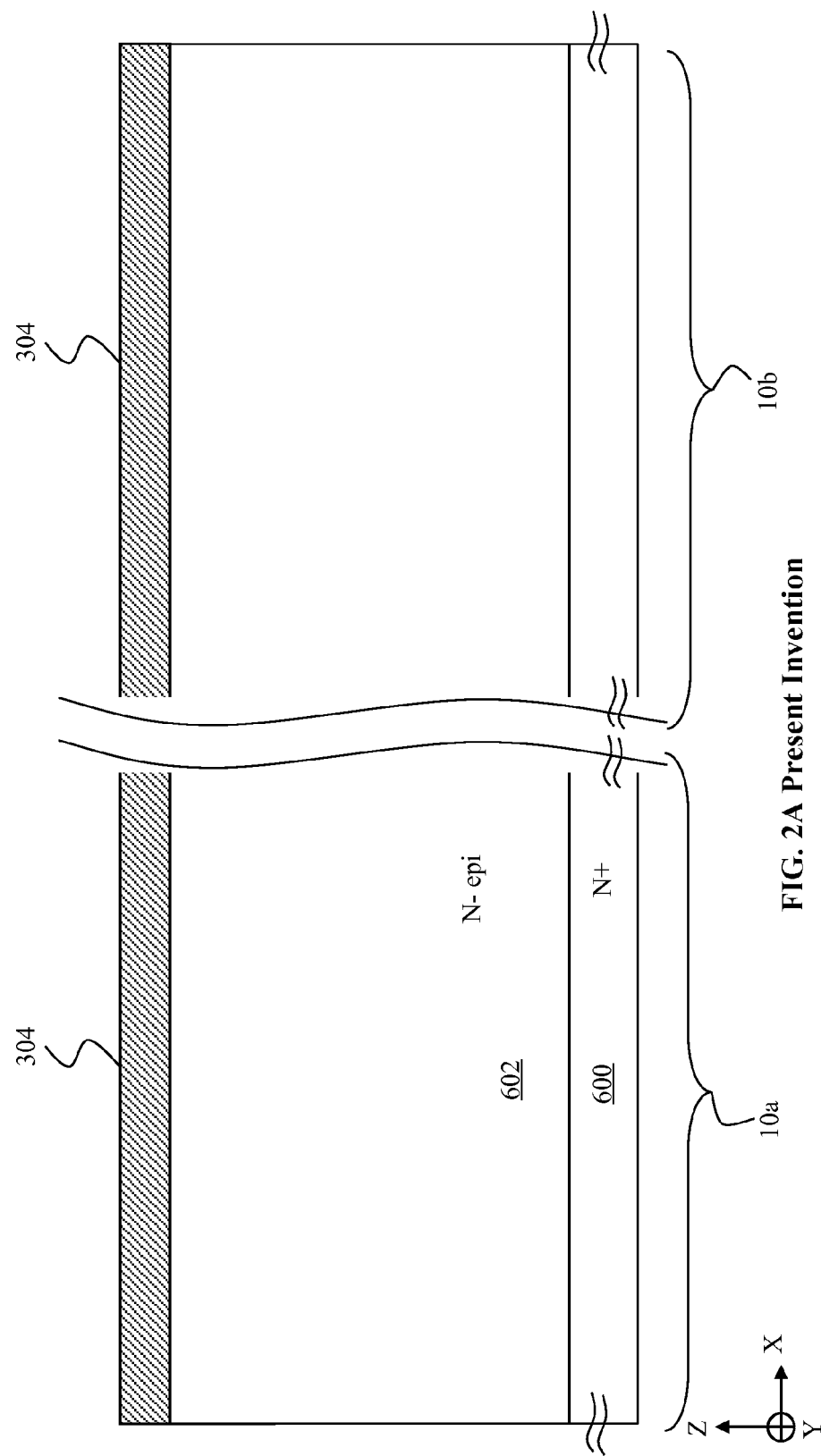
FIG. 2A Present Invention

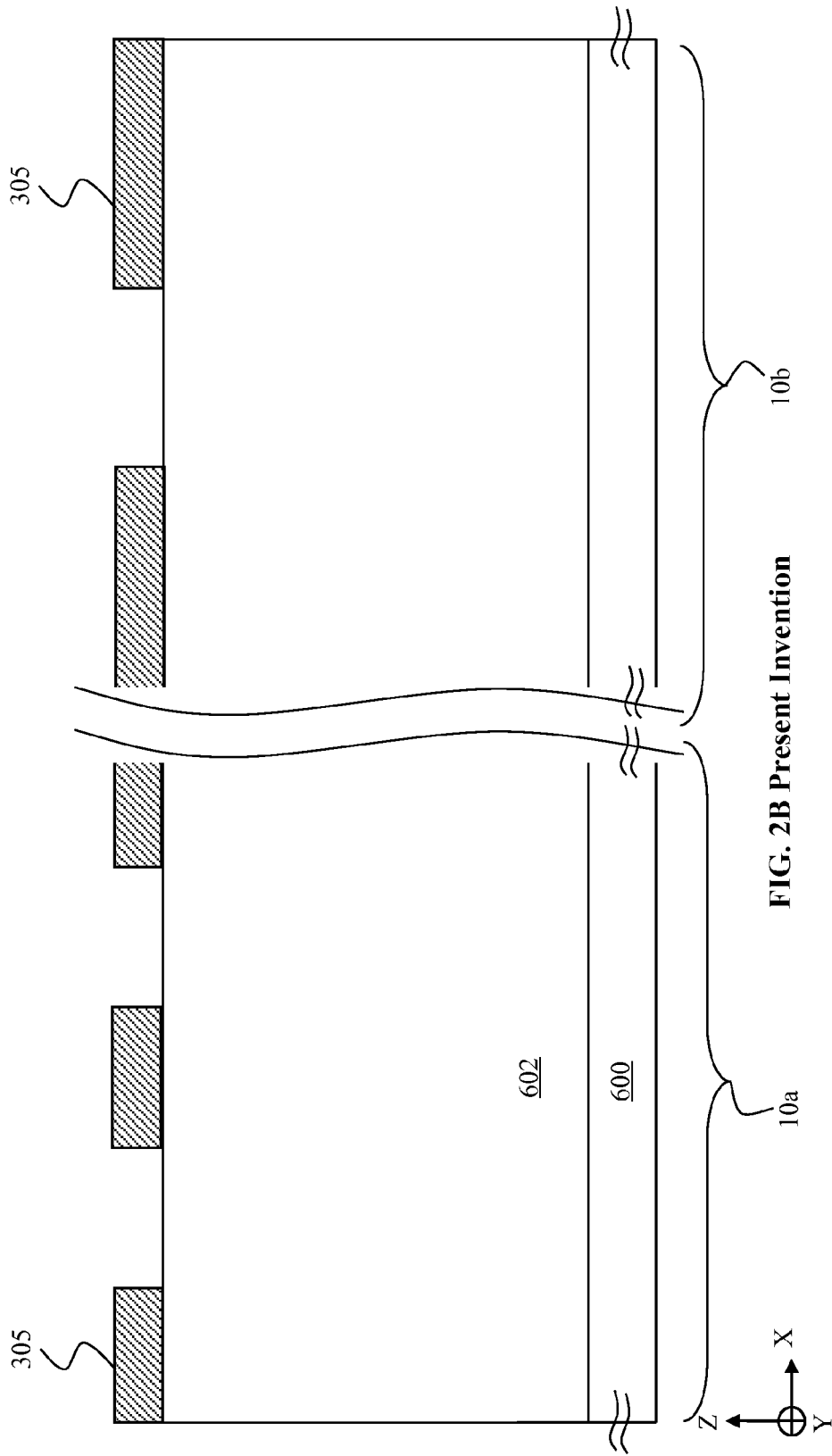

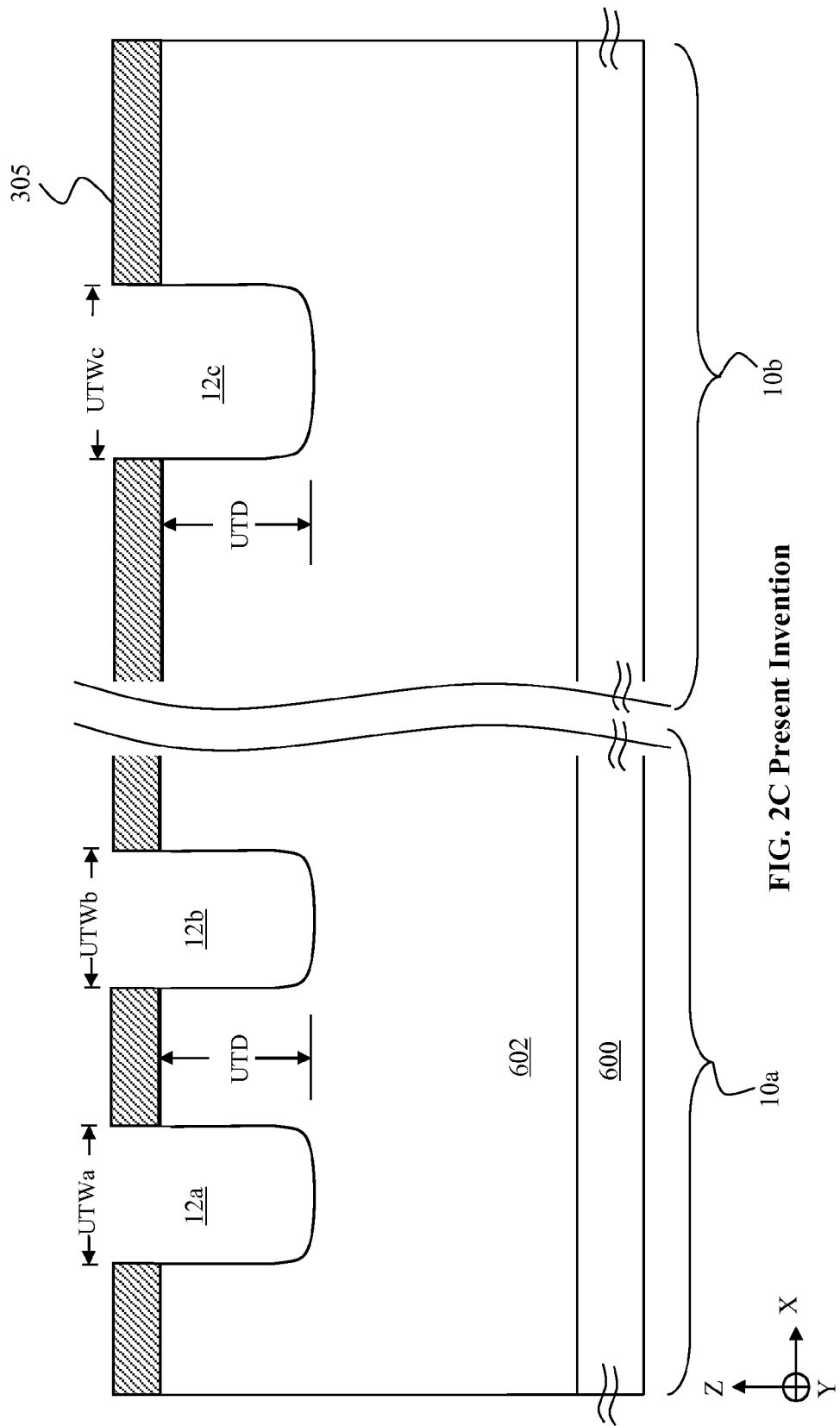
FIG. 2C Present Invention

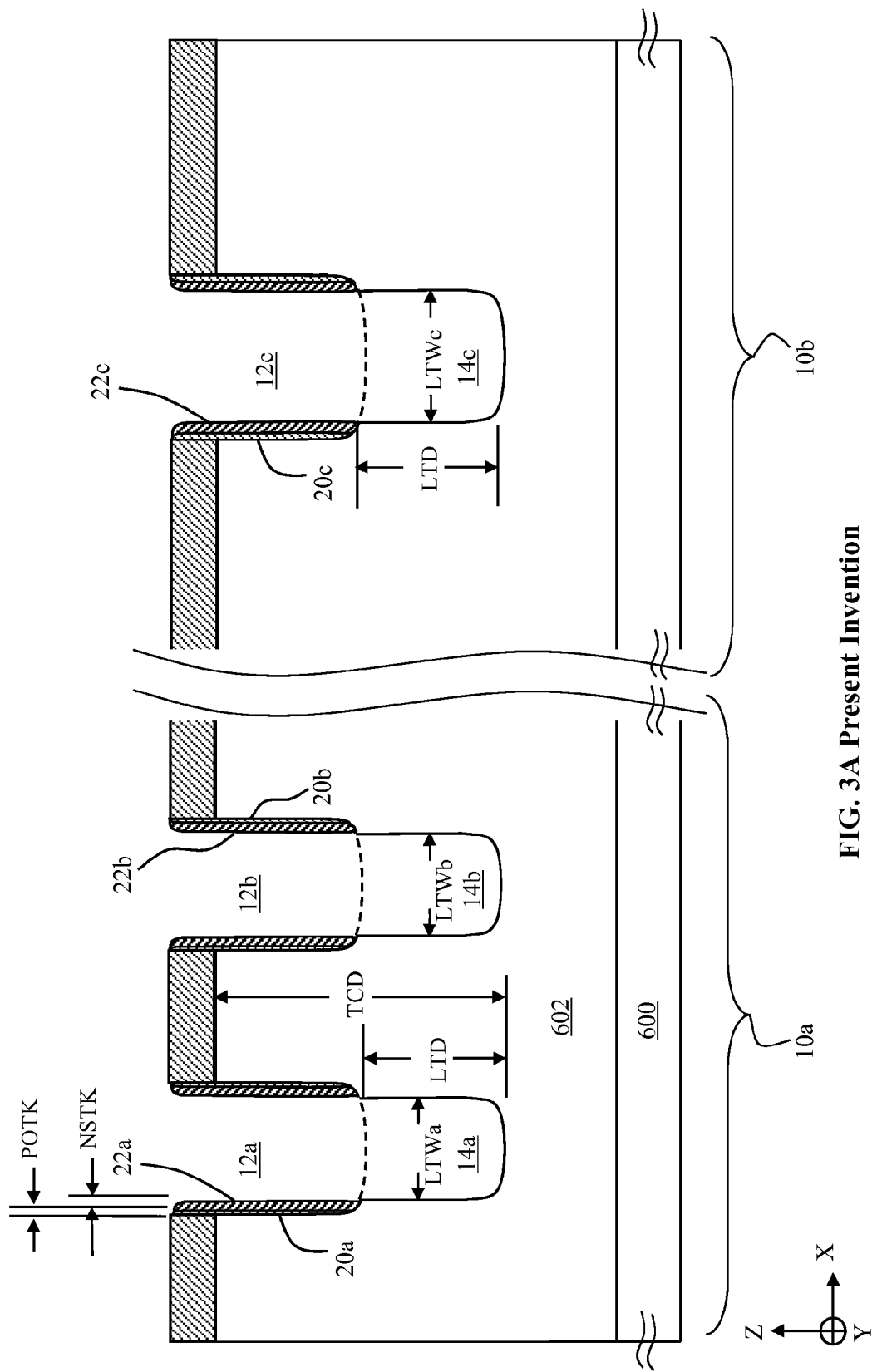
FIG. 3A Present Invention

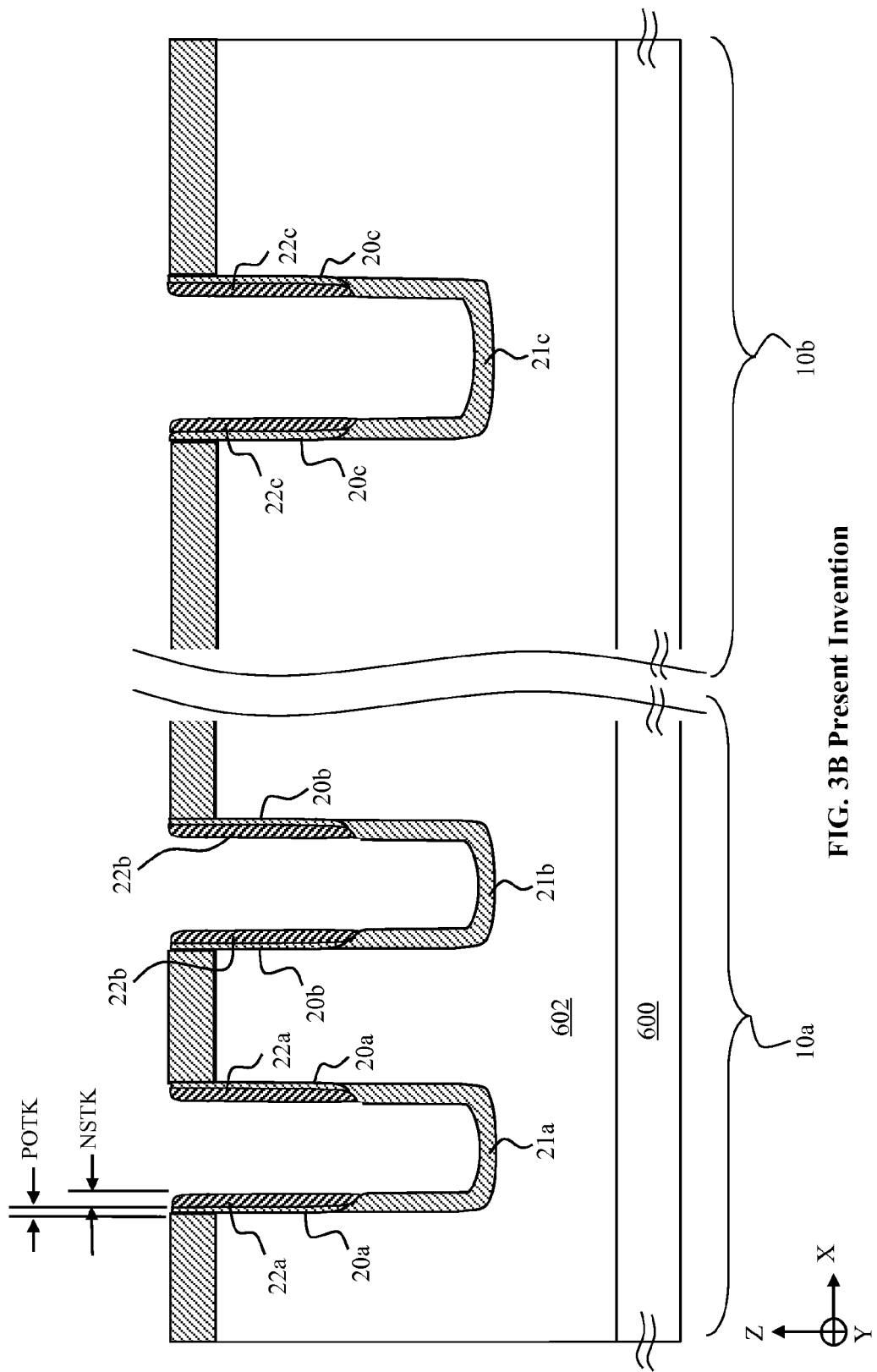
FIG. 3B Present Invention

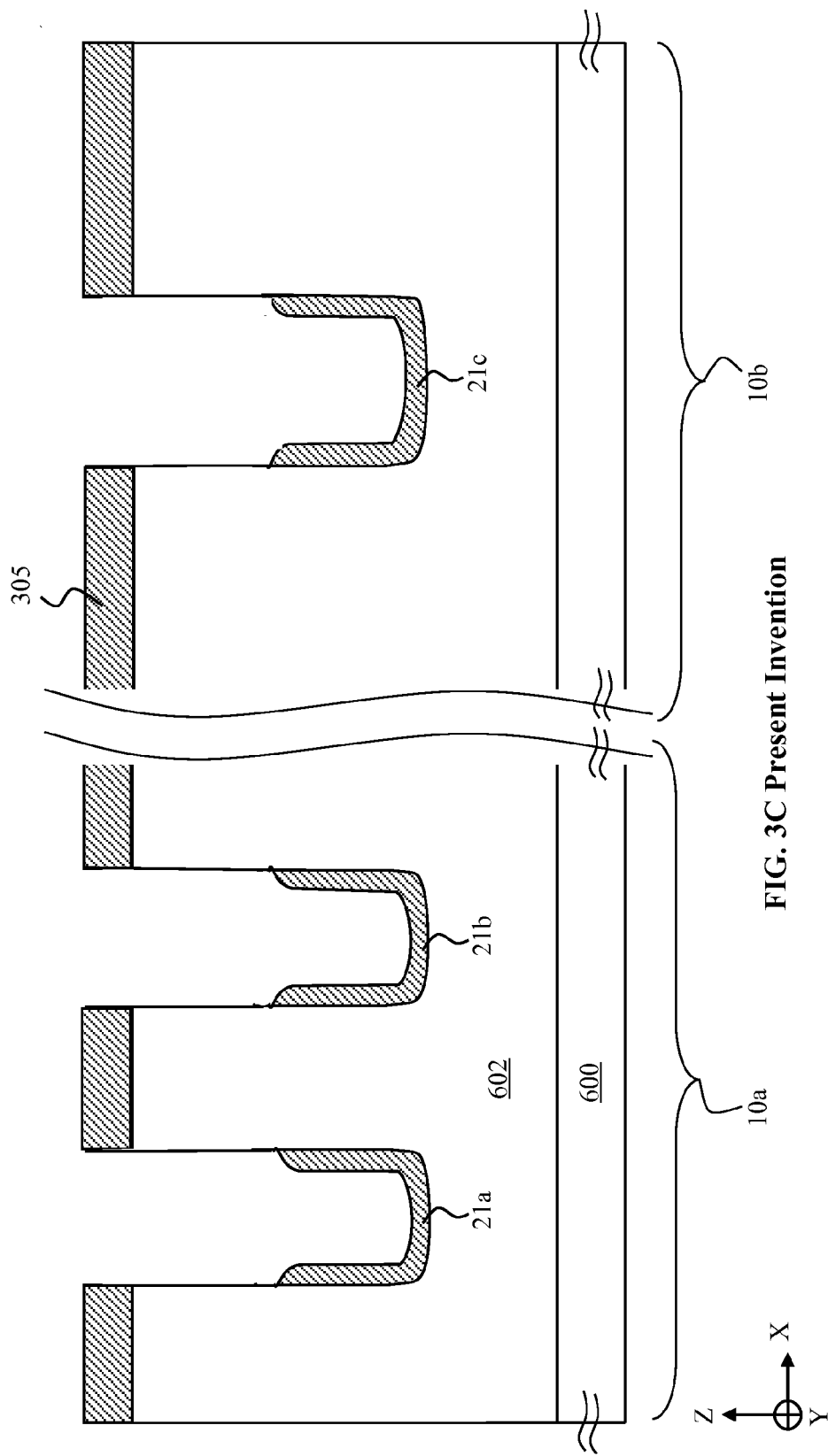
FIG. 3C Present Invention

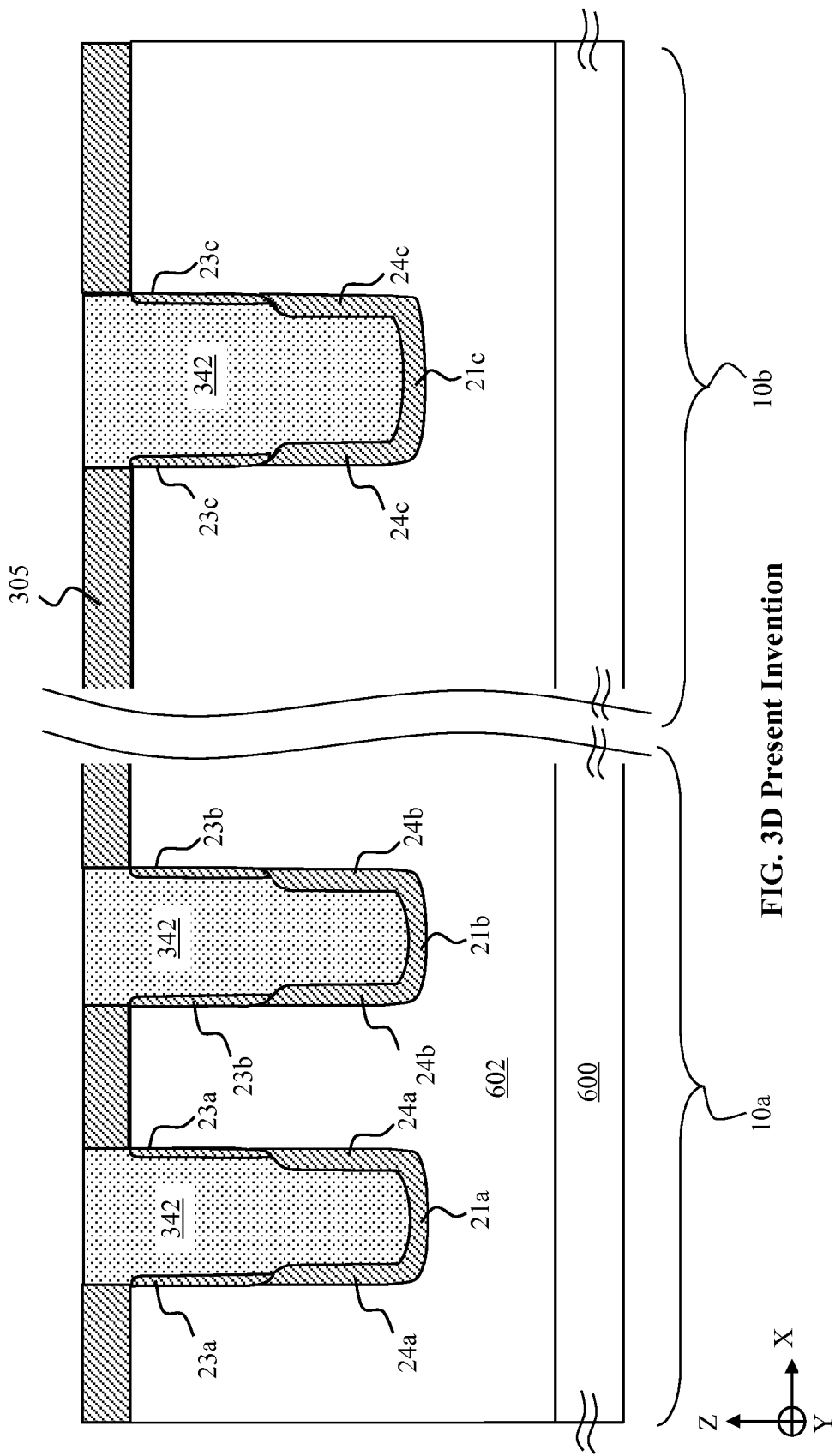
FIG. 3D Present Invention

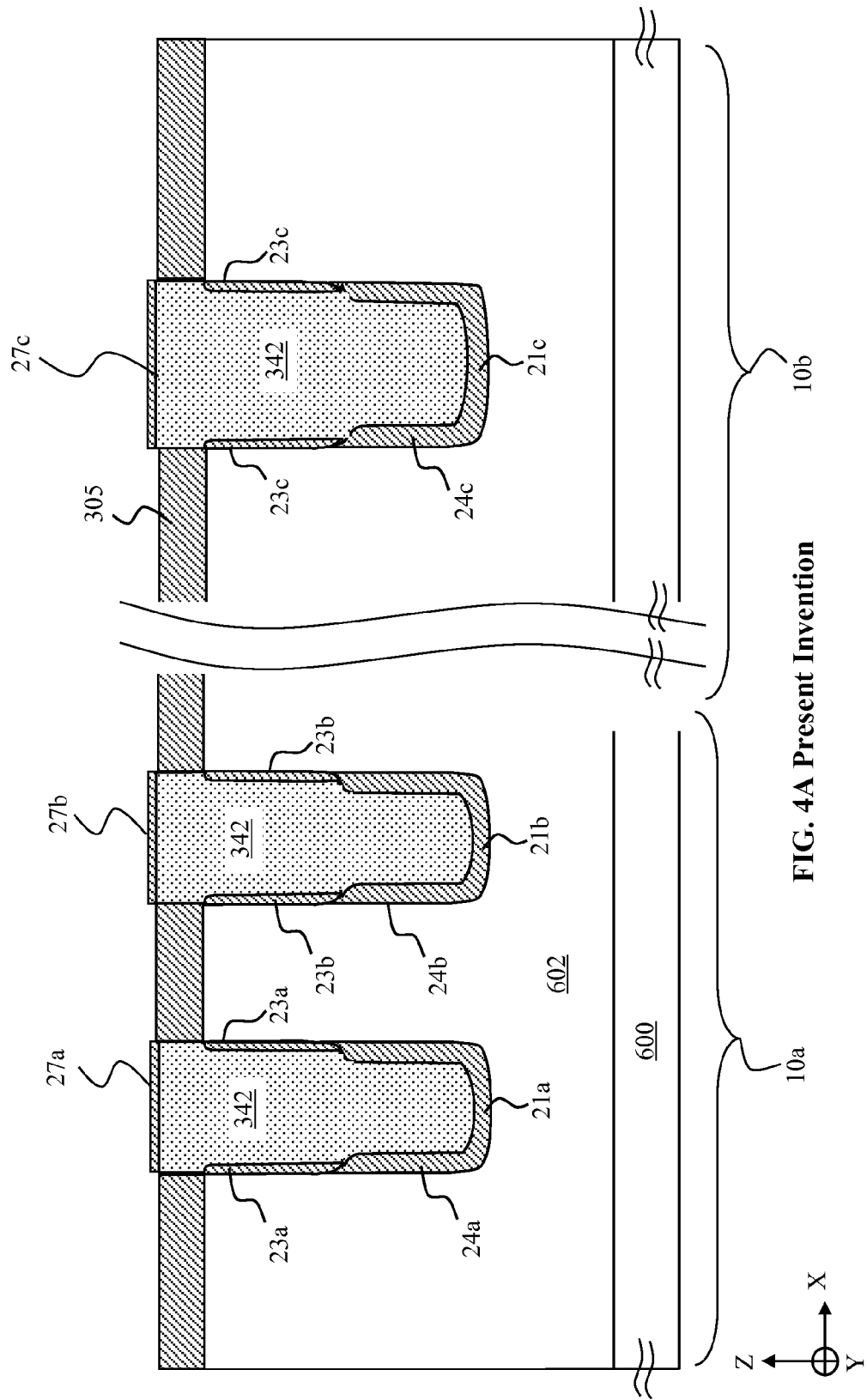
FIG. 4A Present Invention

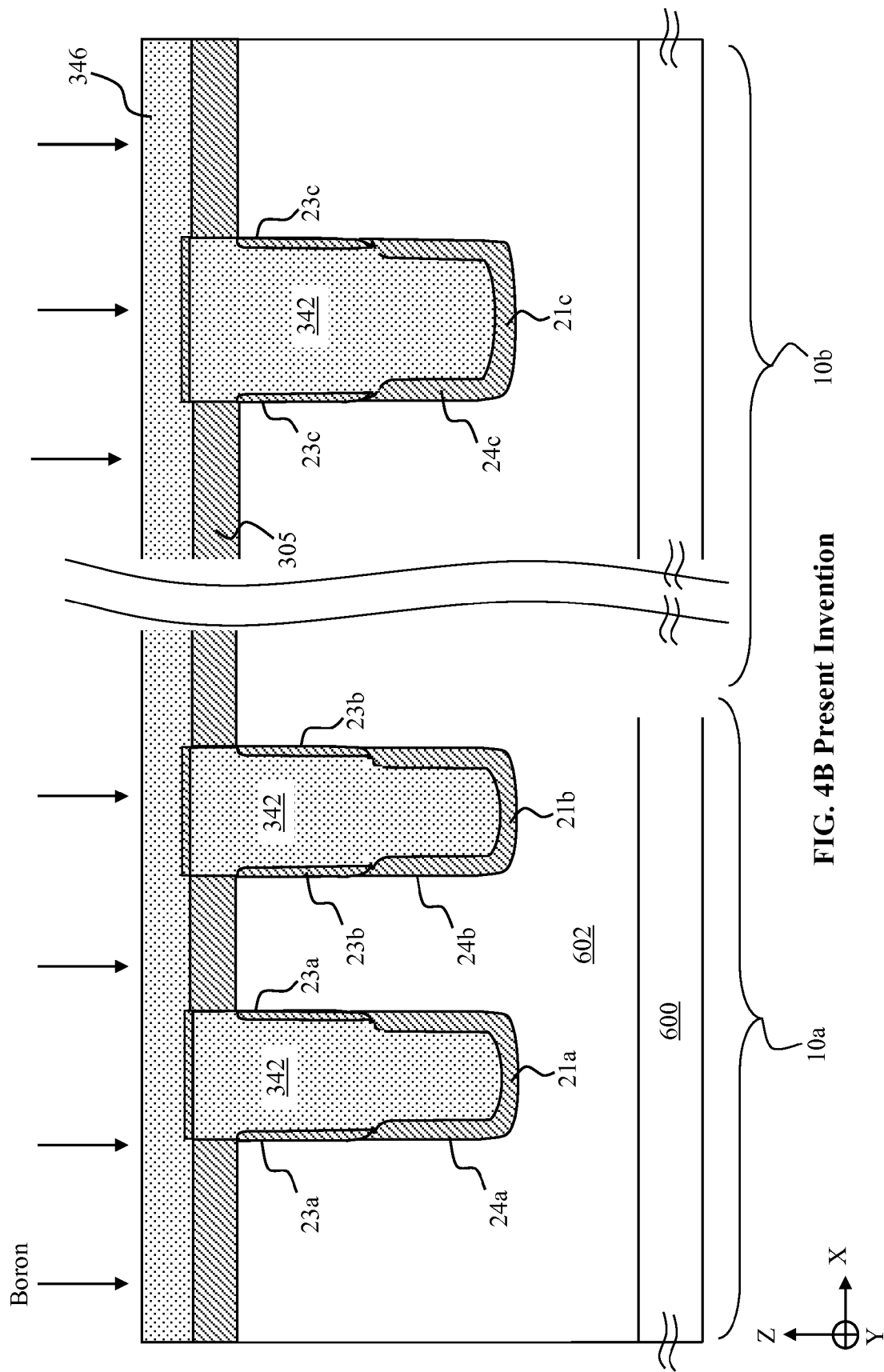
FIG. 4B Present Invention

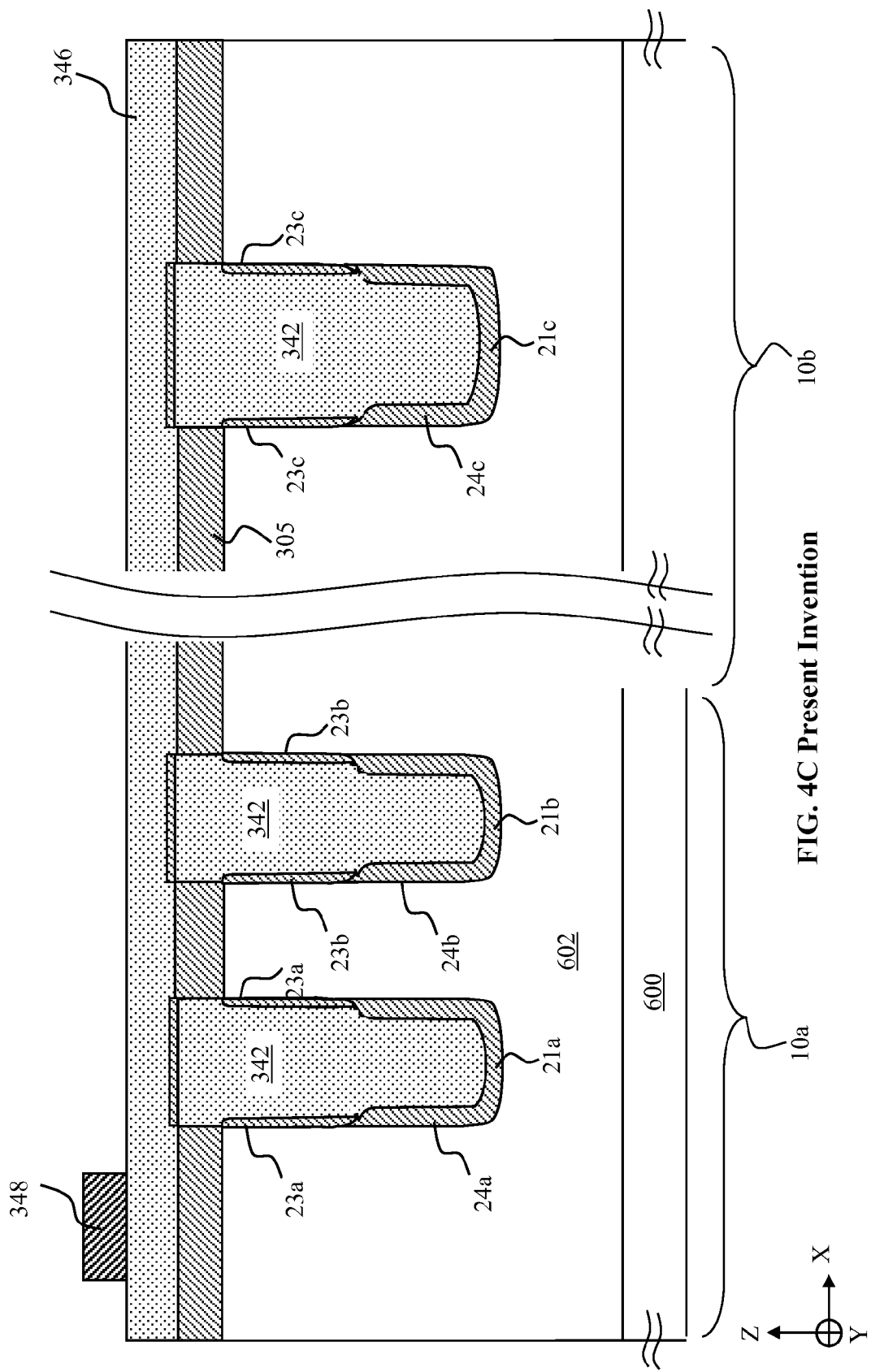
FIG. 4C Present Invention

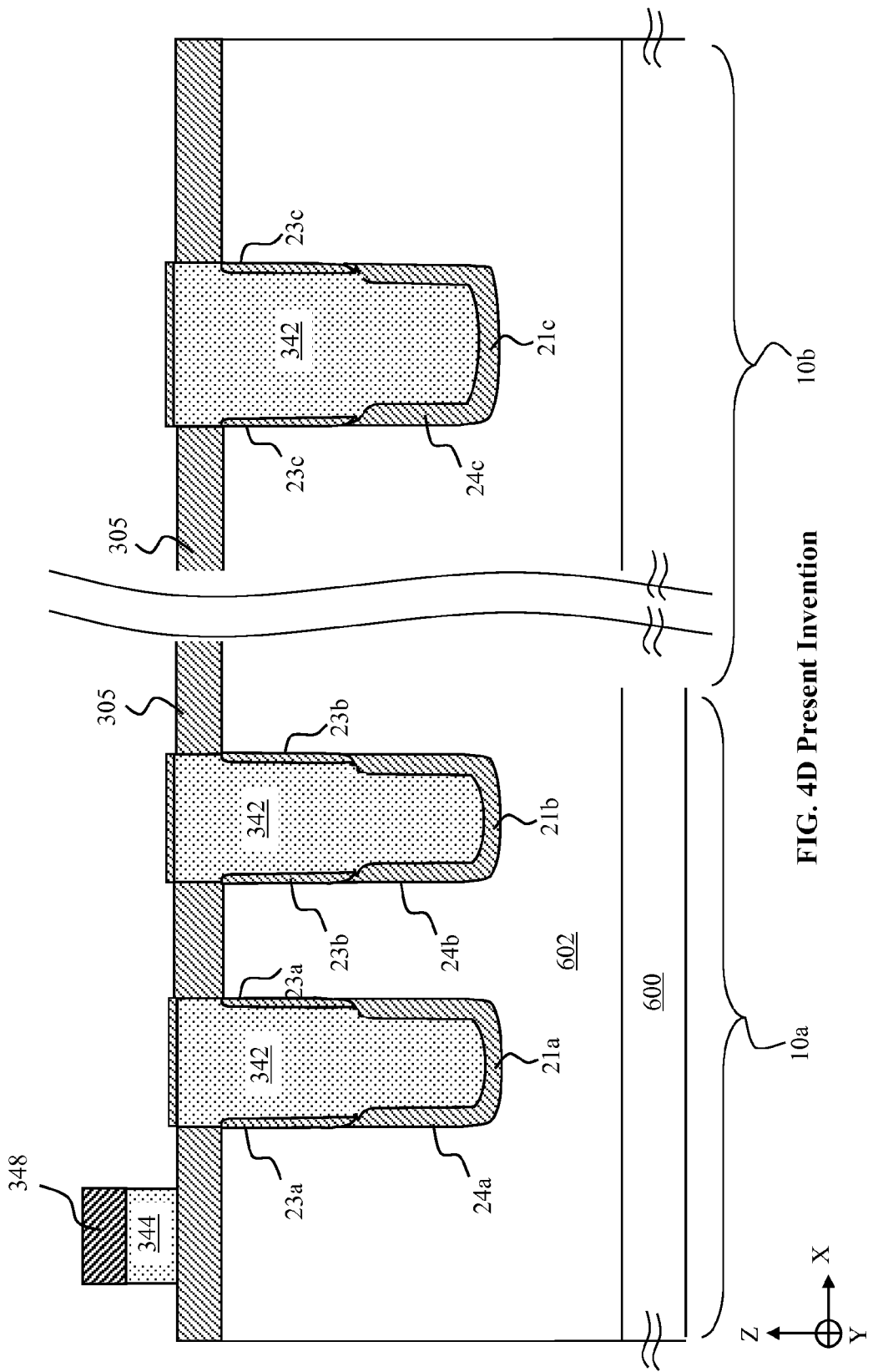
FIG. 4D Present Invention

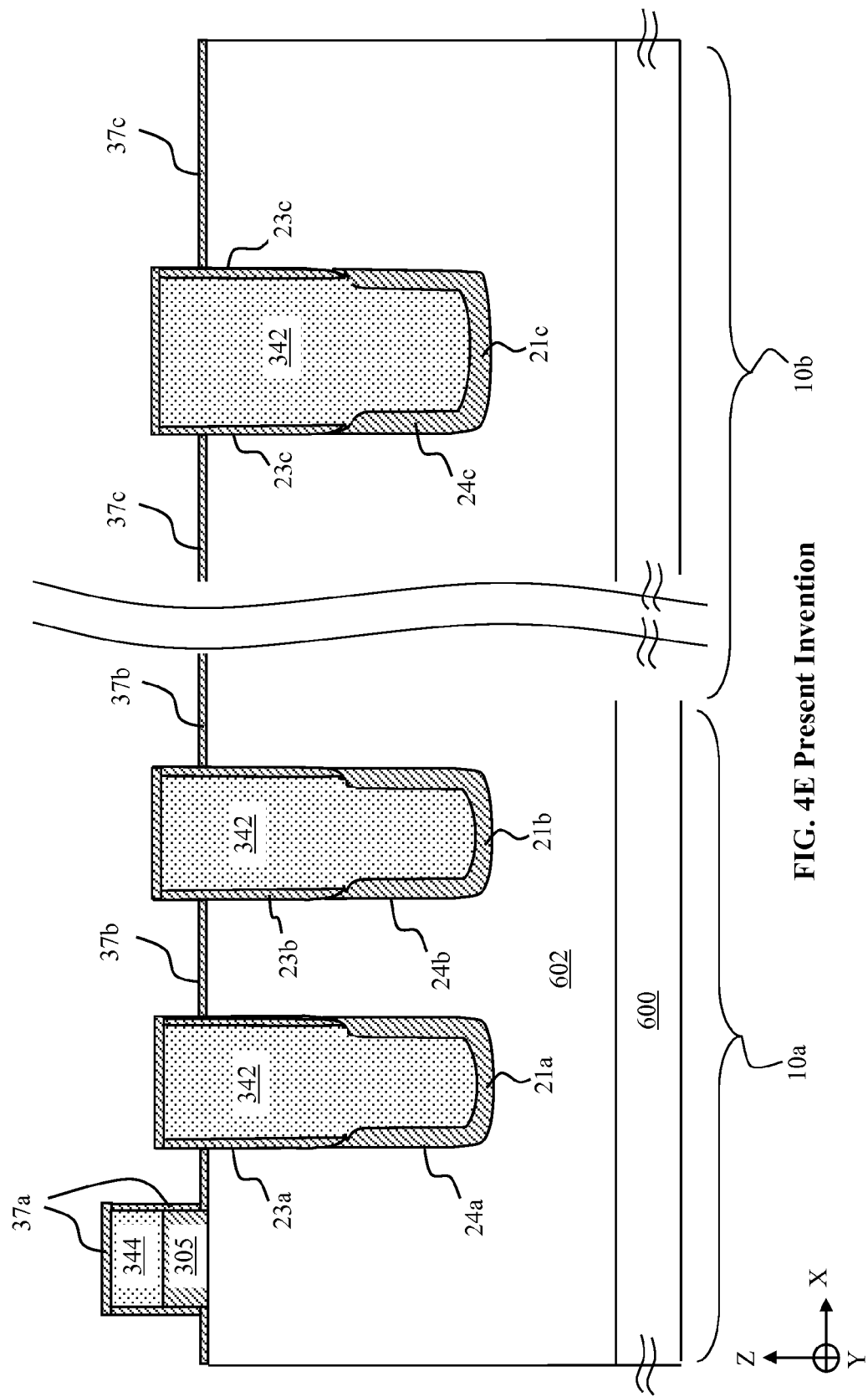
FIG. 4E Present Invention

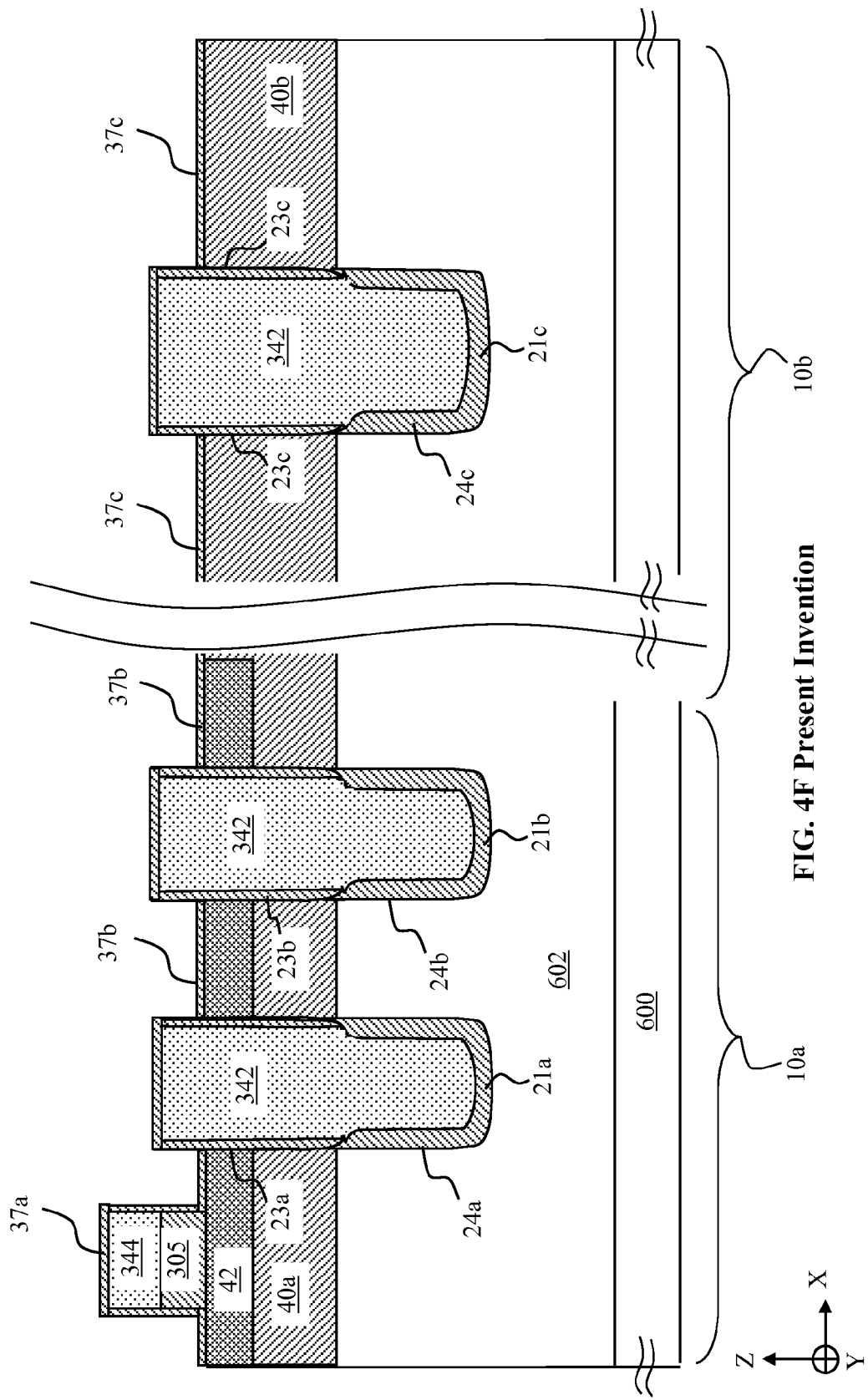
FIG. 4F Present Invention

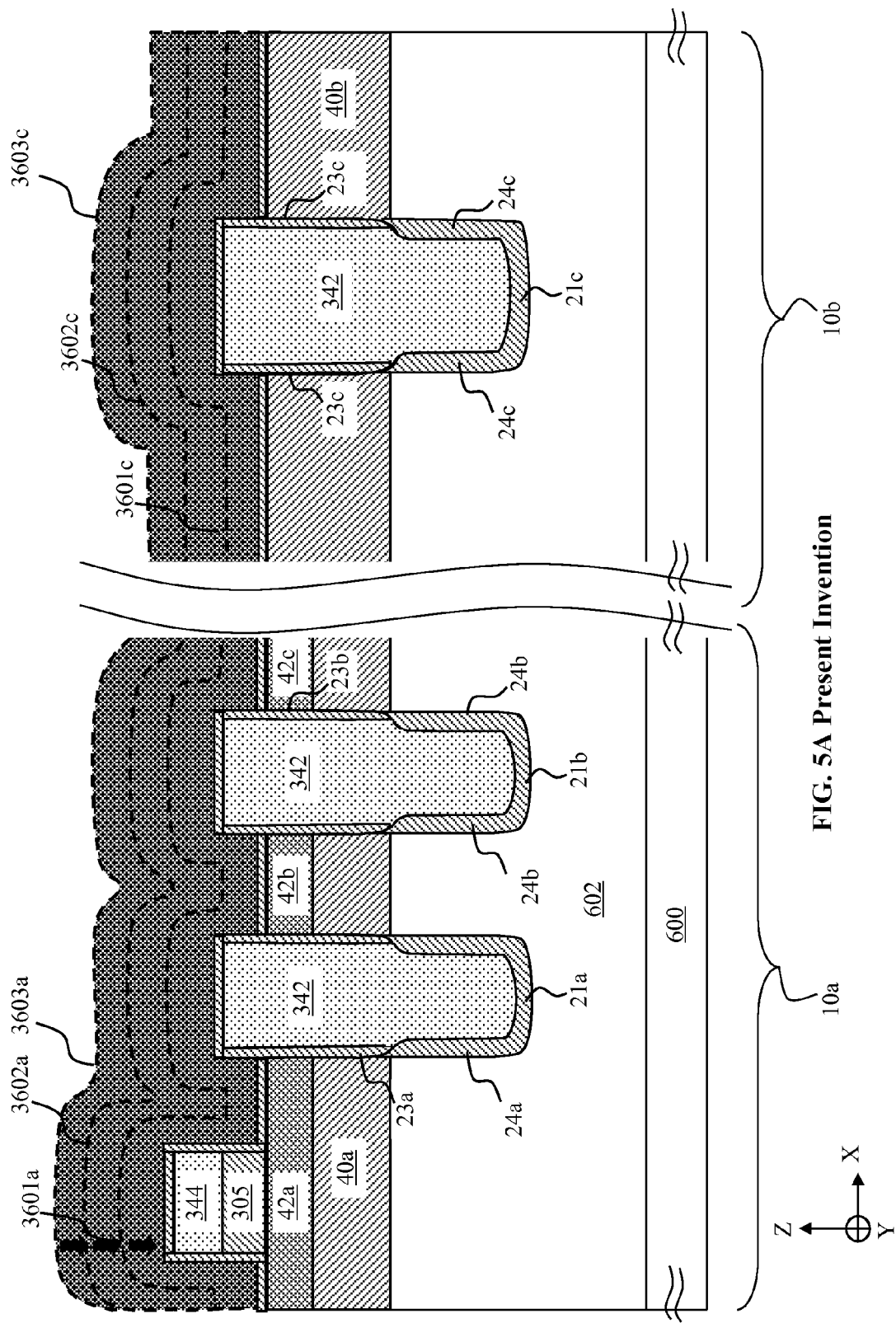
FIG. 5A Present Invention

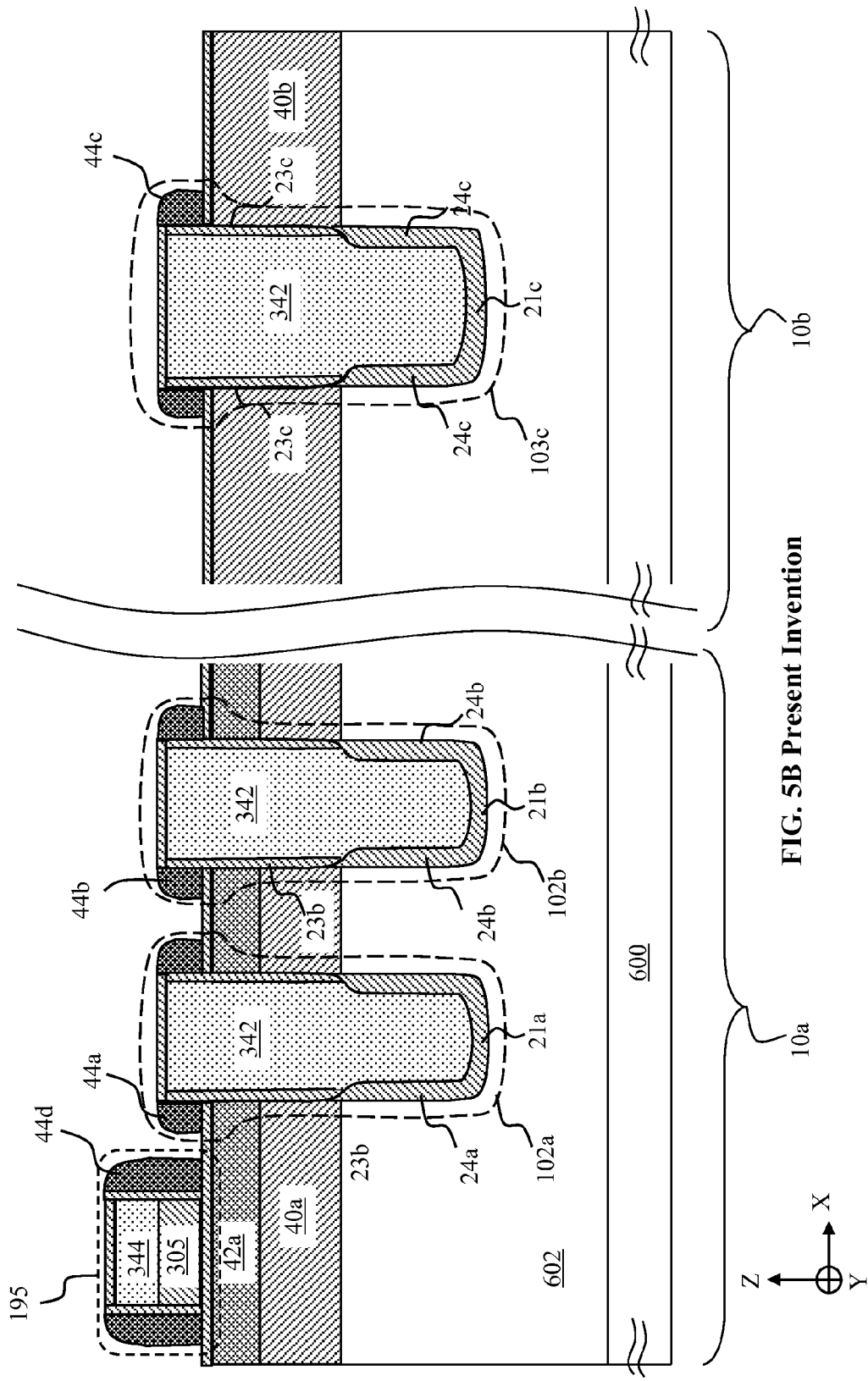
FIG. 5B Present Invention

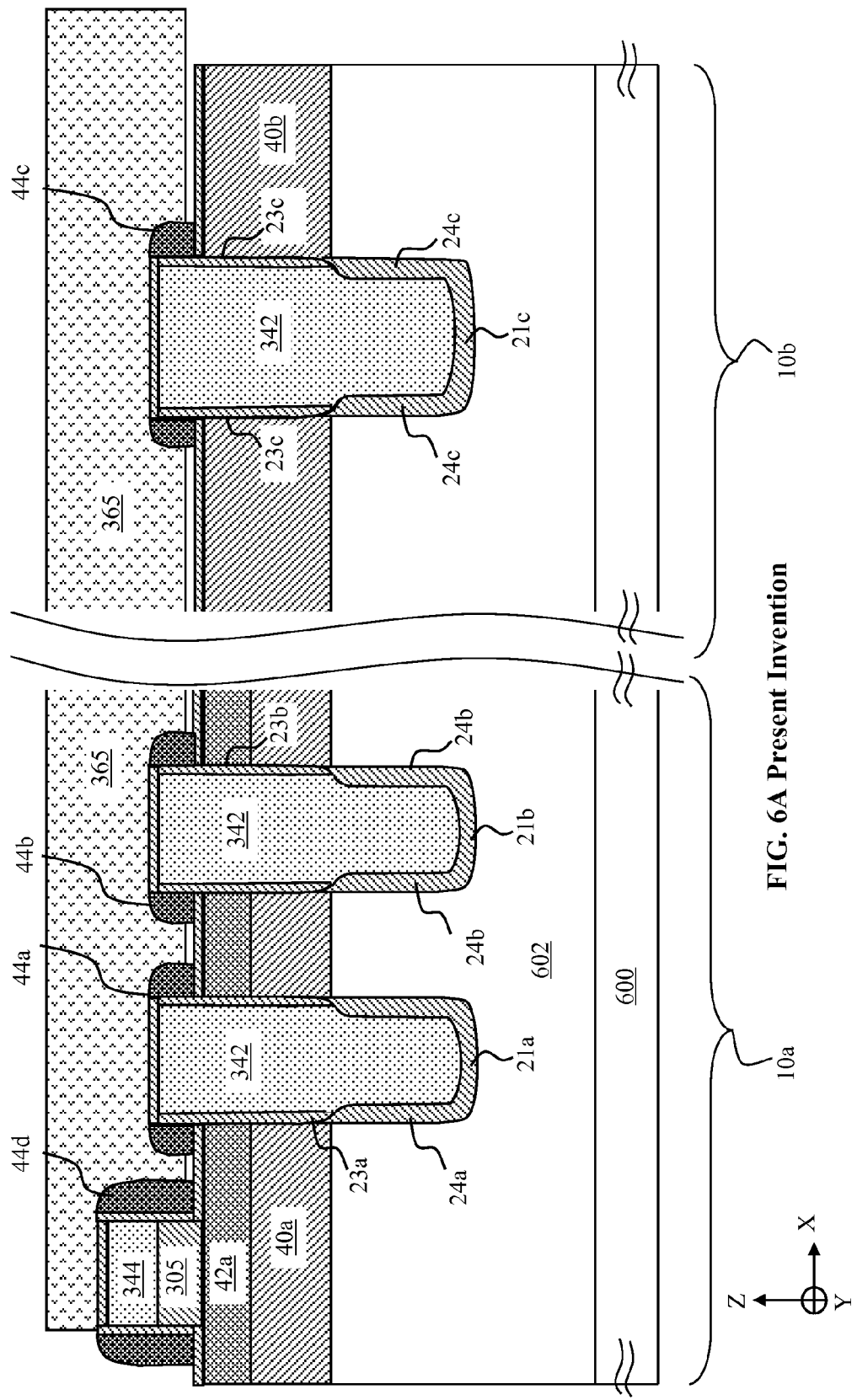
FIG. 6A Present Invention

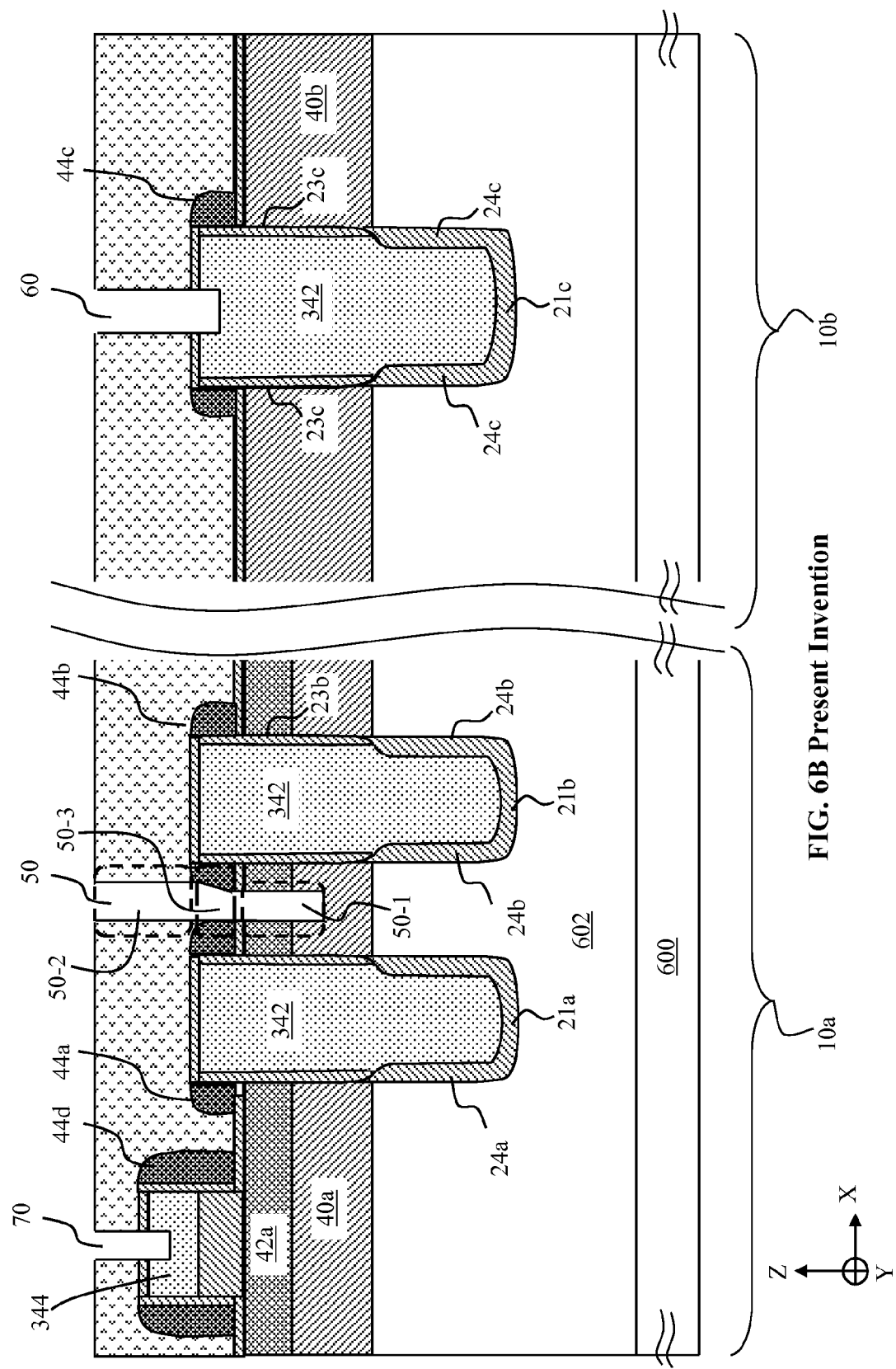
FIG. 6B Present Invention

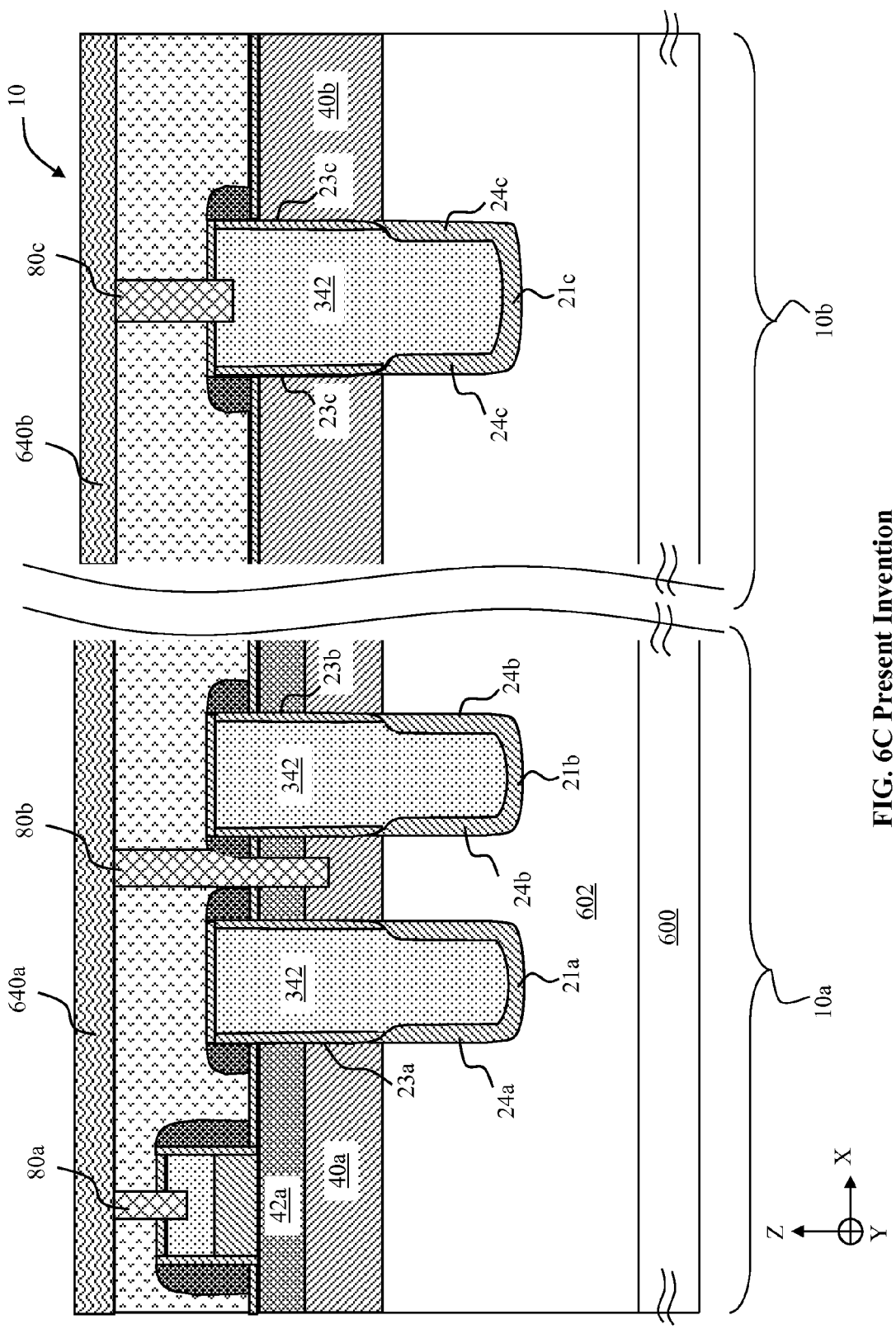
FIG. 6C Present Invention

HIGH DENSITY MOSFET ARRAY WITH SELF-ALIGNED CONTACTS ENHANCEMENT PLUG AND METHOD

CROSS REFERENCE TO RELATED APPLICATIONS

This Patent Application is a divisional of U.S. application Ser. No. 14/197,216, filed on Mar. 5, 2014, which was a continuation-in-part of prior U.S. application Ser. No. 13/794,628, filed on Mar. 11, 2013, now U.S. Pat. No. 9,136,377, granted Sep. 15, 2015. The content of applications Ser. Nos. 14/197,216 and 13/794,628 are hereby incorporated in their entirety.

FIELD OF INVENTION

This invention relates generally to the field of semiconductor device structure. More specifically, the present invention is directed to device structure of a high density MOSFET array and its manufacturing method.

BACKGROUND OF THE INVENTION

Low voltage power MOSFETs are often used in load switching applications. In load switching applications it is desirable to reduce the on-resistance ($R_{ds}$) of the device. Specifically, the $R_{dsA}$ of the device needs to be minimized, where $R_{dsA}$ is the on-resistance of the device multiplied by the active area of the device. Additionally, low voltage power MOSFETs are commonly used in high frequency DC-DC conversion applications. In these applications it is often desirable to maximize the device's switching speed. Three of the most important parameters for optimizing the switching speed are: 1) $R_{ds} \times Q_g$; 2) $R_{ds} \times Q_{OSS}$; and 3) the ratio of $Q_{gd}/Q_{gs}$. First, the product of the $R_{ds}$ and the gate charge ($Q_g$) is a measure of the device conduction and switching losses together. $Q_g$ is the sum of the gate to drain charge ($Q_{gd}$) and the gate to source charge ($Q_{gs}$). In the second parameter, $Q_{OSS}$ is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the body regions, and therefore causes an increase in the $R_{dsA}$. Also, the relatively thin gate oxide generates a high electric field under the trench, which leads to a lower breakdown voltage. Low doping concentrations are needed in the drift region in order to support the voltage, and this increases the $R_{dsA}$ for structures with thinner gate oxides. Further, as cell pitch continues to decrease for high device integration density, the trench based MOSFET may become a less desirable choice because of the difficulty in reducing the thickness of the gate oxide further.

Trench based MOSFETs with two-step gate oxide with a thin layer of oxide near the top of the gate and a thicker layer of oxide in the bottom portion of the gate were designed in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance. However, this device is not easily downwards scalable because it is highly susceptible to body contact misalignment errors. For example, if the pitch of the devices was scaled to the deep sub-micron level e.g., 0.5-0.6 μm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate an ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further away from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate power MOSFET devices with a deep sub-micron pitch that are optimized for use as load switches and high frequency DC-DC applications there is a need for a device and method capable of self-aligning the contacts to the gate in order to prevent the aforementioned side effects.

BRIEF DESCRIPTION OF THE DRAWINGS

To describe numerous embodiments of the present invention, reference is made to the accompanying drawings. However, these drawings are not to be considered limitations in the scope of the invention, but are merely illustrative.

FIGS. 1A, 1B illustrate a plane cross sectional view of a high density trench-gated MOSFET array of the present invention;

FIG. 2A, FIG. 2B, FIG. 2C and FIG. 3A illustrate the creation of active trenches in a MOSFET array area and a pickup trench in a gate pickup area of a semiconductor substrate;

FIG. 3B, FIG. 3C and FIG. 3D illustrate the creation, into the active trenches and the pickup trench, of polysilicon trench gates and gate runner each embedded in a gate oxide shell;

FIG. 4A, FIG. 4B, FIG. 4C, FIG. 4D, FIG. 4E, FIG. 4F, FIG. 5A, FIG. 5B illustrate the creation of an array of active nitride-capped trench gate stacks upon the active trenches, a pickup nitride-capped trench gate stack upon the pickup trench and successive implantation of body regions and source regions hence forming a MOSFET array in the MOSFET array area and a gate pickup structure in the gate pickup area; and FIG. 6A, FIG. 6B, FIG. 6C illustrate the deposition and patterning of dielectric regions atop the MOSFET array and the gate pickup structure and a metal layer atop the dielectric regions.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1A illustrates a plane cross sectional view of a high density trench-gated MOSFET array 10 of the present invention. To facilitate description of spatial, structural relationships within the MOSFET array 10, an X-Y-Z coordinate system with an X-Y plane parallel to the major semiconductor chip plane is employed. The high density trench-gated MOSFET array 10 has:

(1) A semiconductor substrate 600 lying parallel to the X-Y plane and the semiconductor substrate 600 is partitioned, in the X-Y plane, into a MOSFET array area 10*a* and a gate pick-up area 10*b*.

(2) An epitaxial region 602 overlying the semiconductor substrate 600, body implant regions 40*a*, 40*b* overlying the epitaxial region 602 in the MOSFET array area 10*a* and the gate pick-up area 10*b* and source implant region 42 overlying the respective body implant region 40*a* in the MOSFET array area 10*a*.

(3) An array of interdigitated active nitride-capped trench gate stacks (ANCTGS) 102*a*, 102*b* disposed at the top portion of the semiconductor substrate 600 and embedded vertically into the source region 42, the body region 40*a* and the epitaxial region 602 and a pickup nitride-capped trench gate stack (PNCTGS) 102*c* disposed at the top portion of the semiconductor substrate 600 and embedded vertically into the body region 40*b* and the epitaxial region 602. While only two ANCTGS are illustrated here, by now for those skilled in the art the number of ANCTGS can be extended to more than two. Similarly, the number of PNCTGS can be extended to more than one. Importantly, the ANCTGS has predetermined inter-ANCTGS separations in the X-Y plane enabling the formation of the high density trench-gated MOSFET array 10 and this will be presently illustrated with more details. As for more structural detail, the ANCTGS 102*a* comprises a stack of:

(3a) A trench gate stack 100*a* having a poly-silicon trench gate 342 embedded in a gate oxide shell (upper gate oxide 23*a* and lower gate oxide 24*a*) and a gate oxidation 27*a* on top.

(3b) A silicon nitride spacer cap 44*a* covering the top portion above the top surface of the epitaxial layer of poly-silicon trench gate 342.

Importantly, the silicon nitride spacer cap 44*a* is laterally registered, in the X-Y plane, to the gate oxide shell (upper gate oxide 23*a* and lower gate oxide 24*a*) such that in the Z direction center lines of the silicon nitride spacer caps 44*a* are substantially overlapping with center lines of corresponding gate oxide shell.

Therefore, the ANCTGS 102*a* forms, together with the source region 42, the body region 40*a*, and the epitaxial region 602, a MOSFET device in the MOSFET array area 10*a*. Likewise, the similarly structured ANCTGS 102*b* (with trench gate stack 100*b*, poly-silicon trench gate 342, upper gate oxide 23*b*, lower gate oxide 24*b*, top gate oxidation 27*b*, silicon nitride spacer cap 44*b*) forms, together with the source region 42*a*, the body region 40*a*, and the epitaxial region 602, another MOSFET device in the MOSFET array area 10*a*. As a feature of the high density trench-gated MOSFET array 10, the poly-silicon trench gate 342 has an upper trench portion and a lower trench portion and, correspondingly, the gate oxide shell has an upper gate oxide 23*a* and a lower gate oxide 24*a* with thickness of the lower gate oxide 24*a* made larger than that of the upper gate oxide 23*a*. To those skilled in the art, this results in a desired reduction of gate-to-drain capacitance of the related MOSFET. In an alternative embodiment not shown here, the lower gate oxide 24*a* may be the same thickness as the upper gate oxide 23*a* to simplify the manufacturing process if such reduction of gate-to-drain capacitance is not required.

(4) A self-guided contact enhancement plug (SGCEP) 80*b* disposed above the semiconductor substrate and partially embedded into the source region, the body region filling a contact opening 50 between two adjacent active nitride-capped trench gate stacks (ANCTGS) 102*a*, 102*b*, wherein the SGCEP 80*b* comprises, as shown in FIG. 1B:

(4a) a lower intimate contact enhancement section (ICES) 80*b*-1 embedded vertically into the source region and the body region in accurate registration, along the X-Y plane, to its neighboring ANCTGS, the ICES fills a lower portion of the contact opening penetrating the source region into the body region;

(4b) an upper distal contact enhancement section (DCES) 80*b*-2 above the ICES, said DCES having a lateral (along the X-Y plane) mis-registration region (LTMSRG) to said neighboring ANCTGS adjacent to the silicon nitride spacer cap 44*a*, the DCES fills an upper portion of the contact opening above the silicon nitride spacer caps 44*a* and 44*b*; and (4c) an intervening tapered transitional section (TTS) 80*b*-3 located between and bridging the ICES and the DCES, the TTS fills a middle portion of the contact opening substantially extending between the silicon nitride spacer caps 44*a* and 44*b*. As shown in FIG. 1B, the DCES has a center line offset from a center line of the ICES in X-Y plane.

(5) Over both MOSFET array area 10*a* and gate pick-up area 10*b*, a patterned dielectric region 365 and a patterned metal layer 640*a*, 640*b* are formed atop the patterned dielectric region 365. Therefore, the patterned metal layer 640*a* forms, with the MOSFET array, self-guided source and body contacts through the SGCEP hence the LTMSRG does not affect device performance of the MOSFET array.

(6) As for more structural detail, the PNCTGS 102*c* in the gate pick-up area 10*b* comprises a stack of:

(6a) A trench gate stack 100*c* having a poly-silicon gate runner 342 embedded in a gate oxide shell (upper gate oxide 23*c* and lower gate oxide 24*c*) and a gate oxidation 27*c* on top. The polysilicon gate runner 342 of the PNCTGS 102*c* is routed, along an X-Y plane, to join the polysilicon trench gates 342 of the ANCTGS 102*a* and 102*b*.

(6b) A ring-shaped silicon nitride spacer cap 44*c* covering the top portion above the top surface of the epitaxial layer of poly-silicon gate runner 342 with its center hole laterally registered, along the X-Y plane, to the gate oxide shell, said ring-shaped silicon nitride spacer cap covers, except for its center hole, the top sidewall of the polysilicon gate runner whereby the patterned metal layer forms, through the center hole, a gate contact 80*c* to the top of polysilicon gate runner.

(7) An electrostatic discharge ("ESD") protection feature 195 disposed atop the semiconductor substrate, wherein the ESD 195 comprises:

(7a) an ESD electrode 344 formed atop an insulative layer, for example the hard mask 305. The ESD electrode 344 may be formed with polysilicon. The ESD electrode 344 is substantially shielded along all surfaces by an ESD oxide layer 37a.

(7b) A ring-shaped silicon nitride spacer cap 44d covering the ESD electrode 344 and the hard mask 305 with its center hole laterally registered, along the X-Y plane, to the side oxide layer 37a, said ring-shaped silicon nitride spacer cap covers, except for its center hole, the sidewall of the ESD electrode whereby the patterned metal layer forms, through the center hole, a gate contact 80a to the top of ESD electrode.

As an artifact throughout the MOSFET array area 10a of the high density trench-gated MOSFET array 10, a pad oxide region 37b has been formed atop the source region 42b, but beneath the silicon nitride spacer caps 44a, 44b, 44d. Similarly, as another artifact throughout the gate pick-up area 10b of the high density trench-gated MOSFET array 10, a pad oxide region 37c has been formed atop the body region 40b but beneath the pair silicon nitride spacer cap 44c. More remarks on these artifacts 37b, 37c will be given later.

As another feature of the high density trench-gated MOSFET array 10, at the contact interface between the patterned metal layer 640a and the source and body contact, a contact enhancement plug 80b can be added for improving the quality and reliability of the contact interface. Similarly, at the contact interface between the patterned metal layer 640b and the PNCTGS 102c, a contact enhancement plug 80c can be added for improving the quality and reliability of the contact interface, and at the contact interface between the patterned metal layer 640a and the ESD 198, a contact enhancement plug 80a can be added for improving the quality and reliability of the contact interface as well. For example, the contact enhancement plugs 80a, 80b and 80c can be made of tungsten (W).

FIG. 2A through FIG. 5C illustrate the processing steps for making the high density trench-gated MOSFET array 10 of the present invention. FIG. 2A, FIG. 2B, FIG. 2C and FIG. 3A illustrate the creation of active trenches in a MOSFET array area and a pickup trench in a gate pickup area of a semiconductor substrate.

FIG. 2A illustrates the formation of an epitaxial region 602 (for example of an N−conductivity type) upon a semiconductor substrate 600 (for example of an N+conductivity type) then partitioning the device in progress, along its top X-Y plane, into a MOSFET array area 10a and a gate pick-up area 10b. A hard oxide mask 304 made of silicon dioxide is then deposited atop the device in progress.

In FIG. 2B the hard oxide mask 304 is photolithographically patterned into a patterned hard mask 305 according to a pre-determined cross-sectional trench top geometry (X-Y plane) of upper active trenches in the MOSFET array area 10a and a pre-determined cross-sectional trench top geometry (X-Y plane) of pickup trench in the gate pick-up area 10b.

FIG. 2C through FIG. 3A illustrate the creation of an array of active trenches in the MOSFET array area 10a and a pickup trench in the gate pick-up area 10b with the active trenches and the pickup trench extending a predetermined total trench depth TCD partially into the epitaxial region 602. In FIG. 2C upper trenches 12a, 12b, 12c with an upper trench width (UTW$_a$, UTW$_b$, UTW$_c$) and an upper trench depth (UTD) are anisotropically etched out through the patterned hard mask 305. The UTD is achieved with pre-determined etching rate and etching time. In FIG. 3A, pad oxide layer 20a, 20b, 20c of thickness POTK, are grown atop the silicon surface at the sidewall and bottom of the upper trenches 12a, 12b, 12c. A thin nitride spacer layer 22a, 22b, 22c, of thickness NSTK, is then formed upon the pad oxide layer 20a, 20b, 20c. Next, the bottom portion of the nitride spacer layer 22a, 22b, 22c and the pad oxide layer 20a, 20b, 20c are anisotropically etched out to expose the bottom of the upper trenches 12a, 12b, 12c. Lower trenches 14a, 14b, 14c can then be anisotropically etched out into the epitaxial region 602, through the exposed bottom of the upper trenches 12a, 12b, 12c. As a result, the lower trenches 14a, 14b, 14c have a lower trench width (LTW$_a$, LTW$_b$, LTW$_c$) and a lower trench depth (LTD) with the resulting lower trench width<upper trench width. The LTD is achieved with pre-determined etching rate and etching time.

FIG. 3B through FIG. 3D illustrate the creation, into the active trenches and the pickup trench, of polysilicon trench gates and gate runner each embedded in a gate oxide shell. In FIG. 3B a liner oxide layer 21a, 21b, 21c is grown on the silicon surface of the lower trenches 14a, 14b, 14c with thickness of the liner oxide layer>that of the pad oxide layer 20a, 20b, 20c (POTK). In FIG. 3C the nitride spacer layer and the pad oxide layer in the upper trenches are completely removed, for example through a wet dip etching, with a corresponding reduction of the thickness of the liner oxide layer 21a, 21b, 21c in the lower trenches 14a, 14b, 14c. In FIG. 3D an upper gate oxide shell 23a, 23b, 23c is grown on the silicon surface of the upper trenches upon the device in progress resulting in a corresponding lower gate oxide shell 24a, 24b, 24c thicker than that of a corresponding upper gate oxide shell. All the trenches (12a-12c, 14a-14c) in the MOSFET array area 10a and the gate pick-up area 10b are then filled with polysilicon deposition. This completes poly-silicon trench gate or gate runner 342 embedded in a gate oxide shell (23a, 23b, 23c and 24a, 24b, 24c). Recall that, because lower trench width (LTW$_a$, LTW$_b$, LTW$_c$)<upper trench width (UTW$_a$, UTW$_b$, UTW$_c$) it follows that the thickness of a corresponding lower gate oxide shell (24a, 24b, 24c)>that of a corresponding upper gate oxide shell (23a, 23b, 23c). To those skilled in the art, this effects a desired reduction of gate-to-drain capacitance of the related MOSFET.

FIG. 4A, FIG. 4B, FIG. 4C, FIG. 4D, FIG. 4E, FIG. 4F, FIG. 5A, FIG. 5B illustrate the creation of an array of inter-digitated active nitride-capped trench gate stacks upon the active trenches, a pickup nitride-capped trench gate stack upon the pickup trench and successive implantation of body regions and source regions hence forming a MOSFET array in the MOSFET array area 10a and a gate pickup structure in the gate pick-up area 10b. FIG. 4A illustrates a gate oxidation layer 27a, 27b, 27c formed atop the poly-silicon trench gate 342.

FIG. 4B illustrates the blanket deposition of polysilicon layer 346 on top of the device in progress followed by a blanket implantation of P-type dopant, such as Boron, in the polysilicon layer 346 for forming the ESD protection feature.

In FIG. 4C, an ESD mask 348 is applied on the top surface of the polysilicon layer 346.

In FIG. 4D, the polysilicon layer 346 is anisotropically etched back through the hard mask 348 to the top surface of the hard mask 305 forming the ESD electrode 344.

FIG. 4E, the hard mask 305 is anisotropically etched back to the surface of the epitaxial region 602. Next, a pad oxide region 37a, 37b, 37c is then grown on polysilicon surfaces of the device in progress.

FIG. 4F illustrates:
1) Implanting, with a body mask and through the pad oxide region 37a, 37b, 37c, body implant regions 40a, 40b embedded into the top portion of the epitaxial region 602 while protecting the semiconductor surface from an implantation-induced damage with the pad oxide region 37a, 37b, 37c.

2) Implanting, with a source mask and through the pad oxide region 37a, 37b, 37c, source implant region 42 embedded into the top portion of the epitaxial region 602 and atop the body implant region 40a in the MOSFET array area 10a while protecting the semiconductor surface from an implantation-induced damage with the pad oxide region 37a, 37b, 37c.

As a preferred embodiment, thickness of the body region may range from 0.3 micron to 0.7 micron and thickness of the source region may range from 0.1 micron to 0.2 micron. As a related remark on the pad oxide region 37a, 37b, 37c, while it serves to protect the semiconductor surface from an implantation-induced damage and from a later silicon nitride deposition step, the pad oxide region 37a, 37b, 37c does not provide any function in the finished device, so the pad oxide region 37a, 37b, 37c can optionally be removed as an artifact with another process step following the final silicon nitride deposition.

FIG. 5A and FIG. 5B illustrate subjecting the device in progress to a cycle of aerially uniform silicon nitride deposition (FIG. 5A) and silicon nitride etching (FIG. 5B), each with pre-determined deposition rate and deposition time interval to form the silicon nitride spacer cap 44a, 44b, 44c, 44d. To more clearly illustrate silicon nitride deposition, a number of interim, progressive dry deposition surface profiles 3601a, 3602a, 3603a, 3601c, 3602c, 3603c are added in FIG. 5A. The silicon nitride is then dry etched to form the silicon nitride spacer caps 44a, 44b, 44c, 44d in FIG. 5B. To those skilled in the art, therefore, an array of active nitride-capped trench gate stacks (ANCTGS) 102a, 102b and an ESD protection feature 195 have been created in the MOSFET array area 10a and a pickup nitride-capped trench gate stack (PNCTGS) 102c has been created in the gate pick-up area 10b. Importantly, the ANCTGS has predetermined inter-ANCTGS separations in the X-Y plane enabling the formation of a high density trench-gated MOSFET array with self-guided source and body contacts. This is because all the silicon nitride spacer caps 44b are laterally registered, in the X-Y plane, to their closest upper gate oxide shells.

FIG. 6A, FIG. 6B, FIG. 6C illustrate the deposition and patterning of dielectric regions atop the MOSFET array and the gate pickup structure and a metal layer atop the dielectric regions. FIG. 6A illustrates the formation a dielectric region 365 (e.g., made of reflow LTO/BPSG (low temperature oxide/borophosphosilicate glass)) atop the device in progress. In FIG. 6B, the dielectric region 365 is etched, through a contact mask (not shown), through the silicon nitride spacer cap 44a-2 and 44b-1 into the top portion of the epitaxial layer 602 (see FIG. 1B) forming a source/body contact opening 50 between two adjacent ANCTGS 102a, 102b. It is well known in the art that the Si/Ni etching selectivity is about 1/5, therefore the source/body contact opening 50 comprises three sections, which are similar as those shown in FIG. 1B:

a lower intimate contact enhancement section (ICES) 50-1 in accurate registration, along the X-Y plane, to its neighboring ANCTGS;

an upper distal contact enhancement section (DCES) 50-2 above the ICES, said DCES having a lateral (along the X-Y plane) mis-registration (LTMSRG) to said neighboring ANCTGS; and an intervening tapered transitional section (TTS) 50-3 located between and bridging the ICES and the DCES.

As shown in FIG. 1B, the DCES has a center line off set from a center line of the ICES in X-Y plane.

The spacer width and height of the silicon nitride spacer cap 44a, 44b must be properly designed to avoid etching out all the silicon nitride spacer 44b-1, which would cause an electrical connection between the source/body contact and the polysilicon stick up (PSU), which is the top portion of the polysilicon trench gate 342 protruded above the top surface of the semiconductor substrate. Preferably, the spacer width is about 800 Angstrom to about 1000 Angstrom, and the height of spacer width is the same as the height of the PSU, which is about 2000 Angstrom to 3000 Angstrom. During this etching process, a gate contact opening 60 atop the PNCTGS 102c passing through the pad oxide 27c and a top portion of the electrode 342 of the PNCTGS 102c and an ESD contact opening 70 passing through the pad oxide 37a and a top portion of the ESD electrode 344 are also formed.

In FIG. 6C, a thin barrier metal layer (not shown) is deposited in the contact openings 50, 60, 70 followed by the deposition and etching back, to the top surface of the dielectric region 365, a contact metal forming contact enhancement plugs 80a, 80b, 80c. In a preferred embodiment, a thin titanium/titanium nitride (Ti/TiN) barrier metal layer is deposited followed by the deposition of tungsten (W). The high density trench-gated MOSFET array 10 is completed with a final deposition of metal layer 640a, 640b.

While by now it should be understood that the present invention can be practiced with a large range of numerous device geometrical parameters, the following list some geometrical parameters under a preferred embodiment:

Silicon nitride spacer cap 44a, 44b has a width of 500 Angstrom to 1000 Angstrom, preferably 800 Angstrom and a thickness of 1000 Angstrom to 5000 Angstrom, preferably 2000 Angstrom resulting in a device pitch of 0.4 micron-1.2 micron in the MOSFET array;

pair silicon nitride spacer cap 44c, 44d has a width (outer edge to outer edge) of 0.5-1.6 micron and a thickness of 1000-5000 Angstrom; and pad oxide region 37a, 37b, 37c has a thickness of 100-300 Angstrom.

For the polysilicon trench gate 342 in the MOSFET array area 10a:

its upper trench portion has a width of 0.2 micron-0.3 micron, a depth of 0.3 micron-0.6 micron;

its lower trench portion has a depth of 0.3 micron-0.6 micron; and the upper gate oxide shell has a thickness of 100-600 Angstrom while the lower gate oxide shell has a thickness of 300-1000 Angstrom.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method for fabricating a high density trench-gated MOSFET array device, expressed in an X-Y-Z coordinate system with an X-Y plane parallel a major semiconductor chip plane, comprising:
   providing a semiconductor substrate;
   providing an epitaxial region overlying the substrate;
   forming an array of active trenches comprising a plurality of trench gate stacks in a MOSFET array area, each trench gate stack having a poly-silicon gate embedded in a gate oxide shell and a gate oxidation on top, having predetermined separations along the X-Y plane;
   implanting a body implant region embedded into a top portion of the epitaxial region in the MOSFET array area, and implanting a source implant region embedded into the top portion of the epitaxial region and atop the body implant region in the MOSFET array area;
   forming a plurality of silicon nitride spacer caps, each silicon nitride spacer cap being laterally registered, in the X-Y plane, to the gate oxide shell of a trench gate stack such that in the Z direction, a center line of each silicon nitride spacer cap substantially overlaps with a center line of each gate oxide shell to which the silicon nitride spacer cap corresponds, each trench gate stack and corresponding silicon nitride spacer cap in the MOSFET array area constitute an active nitride-capped trench gate stacks (ANCTGS);
   depositing a dielectric region atop the MOSFET array structure;
   forming a contact opening between each pair of adjacent ANCTGS through the dielectric region, the contact opening penetrates into the source implant region and the body implant region;
   forming a self-guided contact enhancement ("SGCEP") in each contact opening, each SGCEP comprises:
      a lower intimate contact enhancement section (ICES) in accurate registration, along the X-Y plane, to adjacent ANCTGS; and
      an upper distal contact enhancement section (DCES) above the ICES, said DCES having a lateral (along the X-Y plane) mis-registration (LTMSRG) to said neighboring ANCTGS;
      an intervening tapered transitional section (TTS) located between and bridging the ICES and the DCES.

2. The method of claim 1, wherein the step of forming an array of active trenches comprising a plurality of trench gate stacks in the MOSFET array area, each trench gate stack having a poly-silicon gate embedded in a gate oxide shell and a gate oxidation on top, having predetermined separations along the X-Y plane, comprises the steps of:
   forming a hard mask layer atop the epitaxial region;
   forming a patterned hard mask by patterning the hard mask layer according to a pre-determined cross-sectional trench top geometry, in the X-Y plane, of an upper active trenches in the MOSFET array area and a pre-determined cross-sectional trench top geometry;
   anisotropically etching through the patterned hard mask a plurality trenches to form a plurality of upper trenches, wherein each upper trench has a corresponding upper trench width and upper trench depth;
   forming a trench pad oxide layer, having a thickness of POTK, on a wall surface and a bottom surface of each upper trench;
   forming a nitride spacer layer, having a thickness of NSTK, upon the trench pad oxide layer;
   anisotropically etching out the trench pad oxide layer and the nitride spacer layer covering the bottom surface of each upper trench to expose the bottom surface of each upper trench;
   etching out a portion of the epitaxial region under the bottom surface of each upper trench to form a plurality of lower trenches, wherein each lower trench has corresponding lower trench width and a lower trench depth, each lower trench corresponding to an upper trench;
   forming a liner oxide layer over a surface of each lower trench;
   removing the trench pad oxide layer in each upper trench;
   forming an upper gate oxide shell on the wall surface of each upper trench;
   filling each upper trench and lower trench with polysilicon deposition.

3. The method of claim 2, wherein the liner oxide layer having a thickness of greater than the thickness of trench pad oxide layer POTK.

4. The method of claim 1, wherein the step of implanting a body implant region embedded into a top portion of the epitaxial region in the MOSFET array area, and implanting a source implant region embedded into the top portion of the epitaxial region and atop the body implant region in the MOSFET array area, comprises the steps of:
   forming a pad oxide region atop the epitaxial region;
   implanting, with a body mask and through the pad oxide region, body implant regions embedded into the top portion of the epitaxial region; and
   implanting, with a source mask and through the pad oxide region, source implant region embedded into the top portion of the epitaxial region atop the body implant region in the MOSFET array area.

5. The method of claim 1, wherein the step of forming the self-guided contact enhancement ("SGCEP") in each contact opening, comprises the steps of:
   forming poly-reoxidation on top of the polysilicon trench gate;
   forming an electrical discharge ("ESD") polysilicon on top of the hard oxide mask;
   etching the hard oxide mask back to the semiconductor substrate;
   growing a pad oxide region on surfaces of the semiconductor substrate, polysilicon trench gate and the ESD polysilicon;
   implanting, with a body mask and through the pad oxide region, body implant regions embedded inside the epitaxial layer while protecting the semiconductor surface from an implantation-induced damage with the pad oxide region;
   implanting, with a source mask and through the pad oxide region, source implant regions embedded inside the epitaxial layer and atop the body implant regions while protecting the semiconductor surface from an implantation-induced damage with the pad oxide region;
   depositing a blanket silicon nitride spacer cap seed covering the device in progress till the blanket silicon nitride spacer cap seed over fills all recessed areas of the pad oxide region;
   progressively etching back the deposited blanket silicon nitride spacer cap seed till it reduces then separates into a number of silicon nitride spacer caps each of a pre-determined minimum width (along the X-Y plane) and minimum height (along the Z-dimension) and covering a corresponding ANCTGS; depositing a dielectric region atop the device in progress then anisotropically etching, through a contact mask, the device in progress till the body region thus forming a source body contact trench (CTCH) having:
- a lower intimate contact trench section (ICTS) in accurate registration, along the X-Y plane, to its neighboring ANCTGS;
- an upper distal contact trench section (DCTS) above the ICTS, said DCTS having a lateral (along the X-Y plane) mis-registration (LTMSRG), due to a misalignment of the contact mask, to said neighboring ANCTGS; and
- an intervening tapered transitional trench section (TTTS) located between and bridging the ICTS and the DCTS; and filling the CTCH by depositing and patterning a metal layer atop the patterned dielectric region thus completing the array of interdigitated ANCTGS and SGCEP.

6. The method of claim 5 wherein said silicon nitride spacer cap has:
- a width from about 500 Angstrom to about 1000 Angstrom; and
- a height from about 1000 Angstrom to about 5000 Angstrom.

7. The method of claim 6 wherein said silicon nitride spacer cap has:
- a width of about 800 angstrom; and
- a height of about 2000 angstrom.

8. A high density trench-gated MOSFET, expressed in an X-Y-Z coordinate system with the X-Y plane parallel to its major semiconductor chip plane, comprising:
- a semiconductor substrate lying parallel to X-Y plane;
- an epitaxial layer formed in an upper portion of the semiconductor substrate, a body region formed in an upper portion of the epitaxial layer and a source region formed in an upper portion of the body region;
- first and second nitride-capped trench gate stacks (ANCTGS), wherein each ANCTGS comprises a stack of:
  - a polysilicon trench gate embedded in a gate oxide shell;
  - a silicon nitride spacer cap covering the top of the polysilicon trench gate; and
- a self-guided contact disposed above the semiconductor substrate and penetrating through the source region into the body region, wherein the self-guided contact comprises:
  - a lower intimate contact enhancement section (ICES) filled with a conductive material in a lower portion of the contact opening penetrating the source region into the body region;
  - an upper distal contact enhancement section (DCES) above the ICES filled with a conductive material in an upper portion of the contact opening above the silicon nitride spacer caps; and
  - an intervening tapered transitional section (TTS) located between and bridging the ICES and the DCES, the TTS filled with a conductive material in a middle portion of the contact opening substantially extending between the silicon nitride spacer caps.

9. The trench-gated MOSFET array of claim 8 wherein the conductive material filling the ICES and the DCES has a center line off set from a center line of the ICES.

10. The trench-gated MOSFET array of claim 8 wherein the conductive material filling the ICES, the DCES and the TTS comprises tungsten.

11. The trench-gated MOSFET array of claim 10 further comprises a patterned dielectric layer atop the silicon nitride spacer caps and a patterned metal layer atop the patterned dielectric layer.

* * * * *